(12) United States Patent
Kim et al.

(10) Patent No.: US 11,302,853 B2
(45) Date of Patent: Apr. 12, 2022

(54) SEMICONDUCTOR DEVICE PACKAGE AND LIGHT SOURCE DEVICE

(71) Applicant: SUZHOU LEKIN SEMICONDUCTOR CO., LTD., Taicang (CN)

(72) Inventors: Ki Seok Kim, Seoul (KR); Hee Jeong Park, Seoul (KR); June O Song, Seoul (KR); Chang Man Lim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 129 days.

(21) Appl. No.: 16/636,457

(22) PCT Filed: Jul. 27, 2018

(86) PCT No.: PCT/KR2018/008583
§ 371 (c)(1),
(2) Date: Feb. 4, 2020

(87) PCT Pub. No.: WO2019/027192
PCT Pub. Date: Feb. 7, 2019

(65) Prior Publication Data
US 2020/0176654 A1 Jun. 4, 2020

(30) Foreign Application Priority Data
Aug. 4, 2017 (KR) .................. 10-2017-0099146

(51) Int. Cl.
*H01L 33/62* (2010.01)
*H01L 33/40* (2010.01)
*H01L 33/46* (2010.01)

(52) U.S. Cl.
CPC ............ *H01L 33/62* (2013.01); *H01L 33/40* (2013.01); *H01L 33/46* (2013.01)

(58) Field of Classification Search
CPC ............ H01L 33/60; H01L 33/44–465; H01L 33/40–42; H01L 23/49582; H01L 23/49866–49888
See application file for complete search history.

(56) References Cited

U.S. PATENT DOCUMENTS 5,703,394 A * 12/1997 Wei ................. H01L 25/167
257/431
2005/0184307 A1 8/2005 Li et al.
(Continued)

FOREIGN PATENT DOCUMENTS

JP 2007-507895 3/2007
JP 2016-072525 5/2016
(Continued)

OTHER PUBLICATIONS

International Search Report dated Nov. 20, 2018 issued in Application No. PCT/KR2018/008583.

*Primary Examiner* — Nicholas J Tobergte
(74) *Attorney, Agent, or Firm* — Birch, Stewart, Kolasch & Birch, LLP

(57) ABSTRACT

A semiconductor device package provided in an embodiment comprises: first and second frames spaced apart from each other; a body disposed between the first and second frames; and a semiconductor device disposed on the first and the second frame and comprising a semiconductor layer and a first and a second electrode on the semiconductor layer, wherein the first and the second frame comprise a first metal layer having a plurality of pores, and the first metal layer of the first and the second frame may comprise coupling portions in regions where the first metal layer overlaps the first and the second electrode, respectively.

21 Claims, 18 Drawing Sheets

(56) References Cited

U.S. PATENT DOCUMENTS

2008/0315238 A1    12/2008  Beckers et al.
2009/0217970 A1     9/2009  Zimmerman et al.
2018/0374834 A1*   12/2018  Tada .................... H01L 33/405

FOREIGN PATENT DOCUMENTS

KR   10-2008-0081331    9/2008
KR   10-2016-0137476   11/2016
WO   WO 2015/066730    5/2015

* cited by examiner

SEMICONDUCTOR DEVICE PACKAGE AND LIGHT SOURCE DEVICE

CROSS-REFERENCE TO RELATED PATENT APPLICATIONS

This application is a U.S. National Stage Application under 35 U.S.C. § 371 of PCT Application No. PCT/KR2018/008583, filed Jul. 27, 2018, which claims priority to Korean Patent Application No. 10-2017-0099146, filed Aug. 4, 2017, whose entire disclosures are hereby incorporated by reference.

FIELD OF THE INVENTION

Embodiments relate to a device package and a light source device having a semiconductor device.

Embodiments relate to a package having a light emitting device and a light source device having the same.

BACKGROUND ART

A semiconductor device including a compound such as GaN, AlGaN and the like may have many merits such as wide and easily adjustable band gap energy, so that the semiconductor device may be used variously as a light emitting device, a light receiving device, various diodes, and the like.

Specifically, as thin film growth technology and device materials have been developed, a light emitting device, such as a light emitting diode or a laser diode, using a Group III-V or II-VI compound semiconducting material has an advantage capable of realizing light of various wavelength bands such as red, green, blue, and ultraviolet light. In addition, a light emitting device, such as a light emitting diode or a laser diode, using a Group III-V or II-VI compound semiconducting material may realize a white light source with high efficiency by using a fluorescent material or by combining colors. Such a light emitting device has advantages of low power consumption, semi-permanent lifetime, a fast response speed, safety, and environmental friendliness as compared with a conventional light source such as a fluorescent lamp, an incandescent lamps, or the like.

In addition, when a light-receiving device such as a photodetector or a solar cell is fabricated by using a Group III-V or Group II-VI compound semiconductor material, since the material of the device material has been developed, light in various wavelength ranges is absorbed to generate optical current, so that light of various wavelength ranges from gamma rays to radio wavelength regions may be used. Further, such a light receiving device may have advantages of a fast response speed, safety, environmental friendliness and easy control of device materials, so that the light receiving device may be easily used for a power control, a microwave circuit or a communication module.

Therefore, the application of the semiconductor device is expanded to a transmitting module of an optical communication transmitting module, a light emitting diode backlight serving as a substitute for a cold cathode fluorescence lamp (CCFL) constituting a backlight of a liquid crystal display (LCD), a white light emitting diode lighting device serving as a substitute for a fluorescent lamp or an incandescent lamp, a vehicle headlight, a signal lamp and a sensor for detecting gas or fire. In addition, the application of the semiconductor device may be expanded to a high-frequency application circuit, other power control devices, and a communication module.

A light emitting device may serve as a p-n junction diode having a characteristic of converting electric energy into light energy by using group III-V or II-VI elements of the periodic table, and may provide various wavelengths by controlling the composition ratio of compound semiconductors.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, in the semiconductor device package, studies on a method for reducing the manufacturing cost and improving the manufacturing yield by improving the process efficiency and changing the structure have been performed.

SUMMARY OF THE INVENTION

The embodiment provides a semiconductor device package or a light emitting device package including a frame having a porous metal layer.

The embodiment provides a semiconductor device package or a light emitting device package including a coupling portion between a porous metal layer and a pad of a semiconductor device or a light emitting device.

The embodiment provides a semiconductor device package or a light emitting device package in which a coupling portion having a metal constituting a porous metal layer may be a low temperature bonding.

The embodiment provides a semiconductor device package or a light emitting device package capable of low temperature bonding of a coupling portion having a metal constituting a pad of a semiconductor device or a light emitting device.

The embodiment may provide a semiconductor device package, a light emitting device package, or a light source device that may prevent a coupling portion of the device from being re-melted while the semiconductor device or the light emitting device package is bonded to a circuit board or the like.

A semiconductor device package according to an embodiment may comprise: first and second frames spaced apart from each other; a body disposed between the first and second frames; and a semiconductor device disposed on the first and second frames and including a semiconductor layer and first and second electrodes disposed under the semiconductor layer, wherein the first and second frames include a first metal layer having a plurality of pores, and the first metal layers of the first and second frames may include a coupling portion formed in respective regions that overlap the first and second electrodes.

According to an embodiment, the coupling portion may have an area larger than an area each of the first and second electrodes.

According to an embodiment, the first metal layer may include at least one of Cu, Au, Ag, and Al, and the electrode may include at least one of Ti, Cr, Ni, Sn, In, Pd, Cu, Au, and Ag.

According to an embodiment, the coupling portion includes at least one of $Ag_xIn_y$, $Cu_xSn_y$, $Ag_xSn_y$, $Au_xSn_y$, $Cu_xNi_y$, and $Al_xSn_y$, where it has a relationship of x is $0<x<1$ and $y=1-x$.

According to an embodiment, the first metal layer may be disposed in a region overlapping the semiconductor device in a vertical direction.

According to an embodiment, the first metal layer may be disposed on some or all regions of the first and second frames.

According to an embodiment, comprising a package body coupled to the first and second frames, and the first metal layer of the first and second frames may be exposed on a bottom of the cavity of the package body, and the first and second electrodes of the semiconductor device may face the first and second frames in the cavity.

According to an embodiment, the semiconductor device may include a reflective portion made of a resin material between the semiconductor device and the body, wherein the reflective portion may be in contact with the semiconductor device and the first and second frames, the reflective portion may be disposed on the first metal layers of the first and second frames, and wherein the semiconductor device may include a light emitting device.

According to an embodiment, the first metal layer may be disposed on a region overlapping the package body, and a portion of the package body may be disposed in pores of the first metal layer.

According to an embodiment, the first metal layer may have at least one of an opening and a concave groove therein, and a reflection portion of the body or resin material may be disposed in at least one of the opening and the concave groove.

According to an embodiment, the first metal layer may be exposed to the side of the package body.

According to an embodiment, the body may include a concave recess or through-hole that penetrates the body, an adhesive between the body and the semiconductor device, and the adhesive may be disposed in the recess or the through-hole.

It may include a light source device having a light emitting device package according to the embodiment.

ADVANTAGEOUS EFFECTS

In the embodiment, since the coupling portion is formed in the porous metal layer, a short problem due to overflow of a paste may be prevented.

The embodiment may prevent deformation of the package body due to flux.

In an embodiment, the light efficiency of the light emitting device may be improved.

The embodiment may bond the light emitting device with high strength at low temperature by a coupling portion bonded to the porous metal layer.

The Embodiment may reduce deformation or discoloration of the package body by a low temperature bonding.

In the embodiment, since the light emitting device is bonded to the coupling portion of a low temperature, re-melting may be prevented from occurring in the bonding region of the device package while the device package is re-bonded onto the circuit board.

The embodiment may improve the reliability of the semiconductor device package or the light emitting device package.

The embodiment may improve the reliability of a module having a semiconductor device package or a light emitting device package.

DETAILED DESCRIPTION

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it may be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package according to an embodiment of the invention will be described in detail with reference to the accompanying drawings. In the device package, the device may be a light emitting device that emits light of ultraviolet, infrared, or visible light, a non-light emitting device, a sensing device that senses wavelength or heat, or a protection device such as a Zener diode. Hereinafter, an example of a device is described as an example of a light emitting device, and may be defined as a package, a module, or a light source device to which the device is applied.

Figure 1:
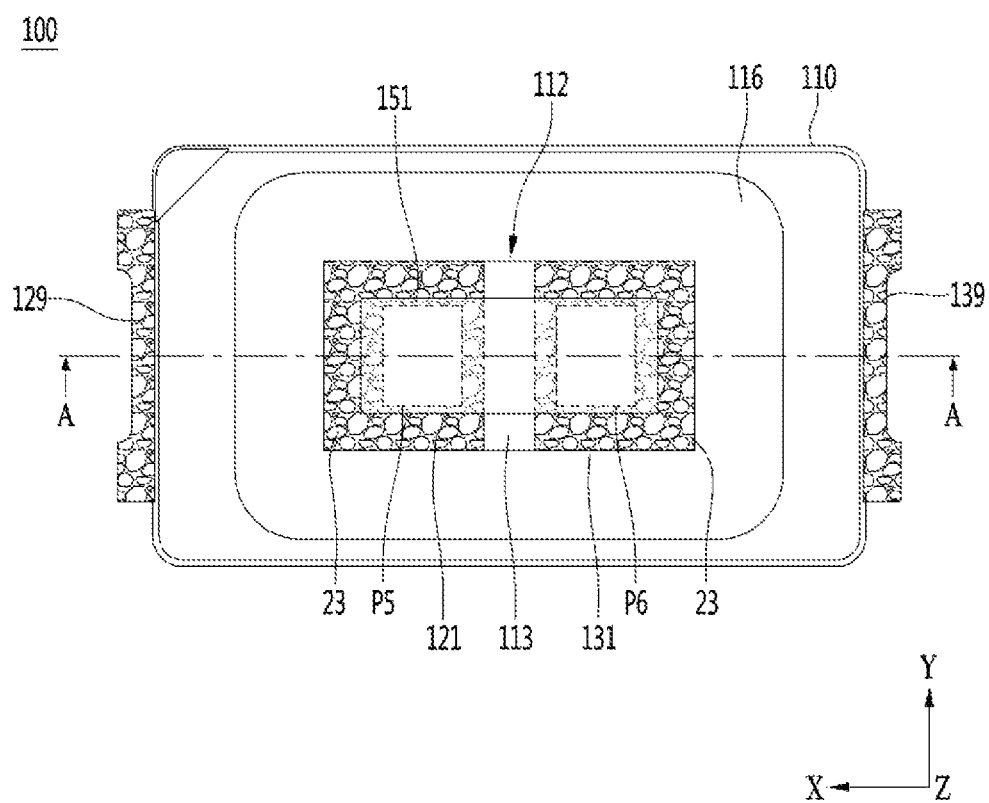
FIG. 1 is a plan view of a device package according to a first embodiment.
Figure 2:
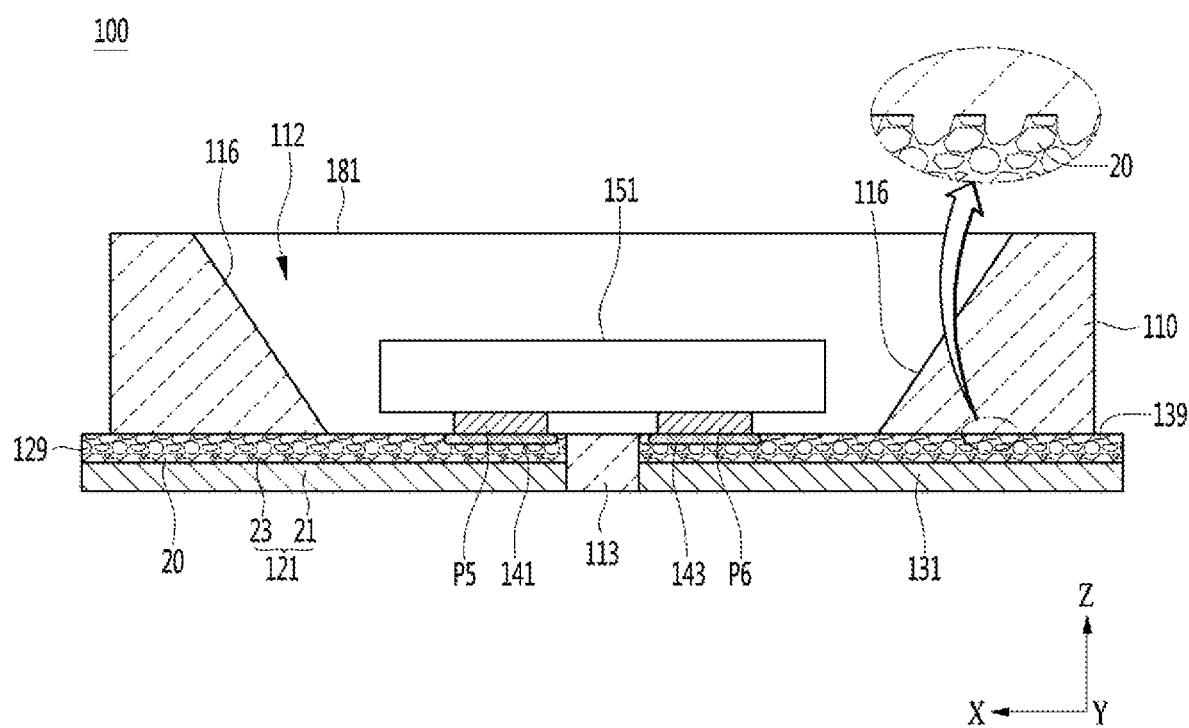
FIG. 2 is a cross-sectional view taken along the A-A side of the semiconductor device package of FIG. 1.
Figure 3:
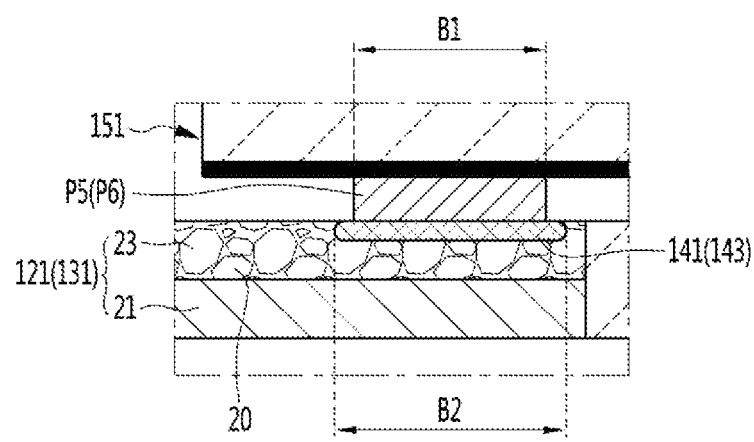
FIG. 3 is a partially enlarged view of FIG. 2.
Figure 4:
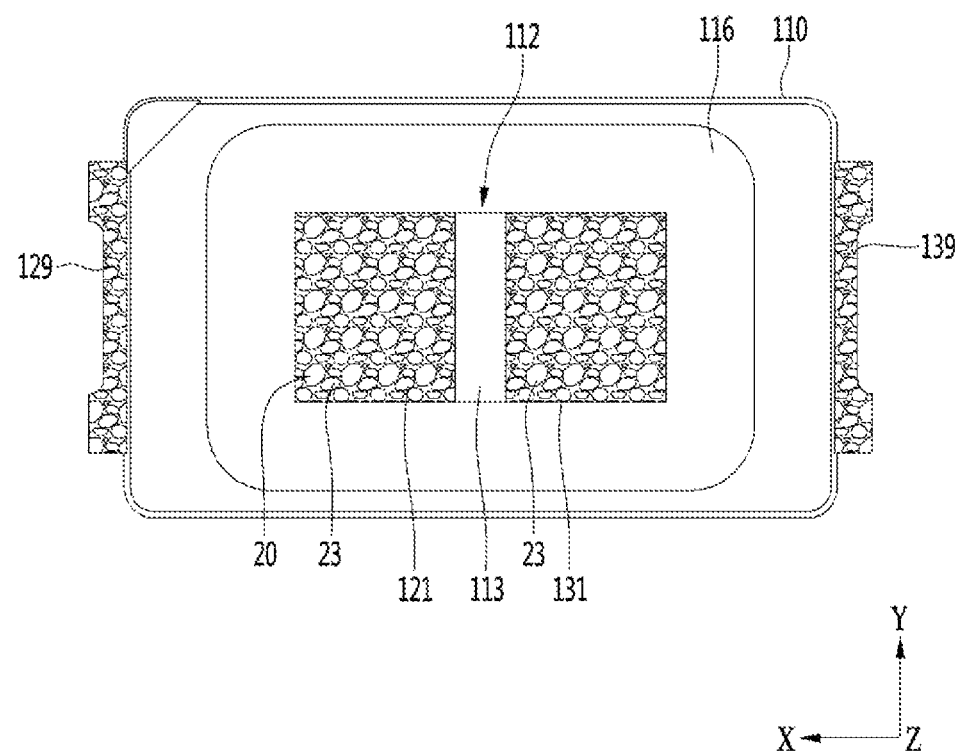
FIG. 4 illustrates an example of a porous metal layer in which a semiconductor device is removed from FIG. 1.
Figure 5:
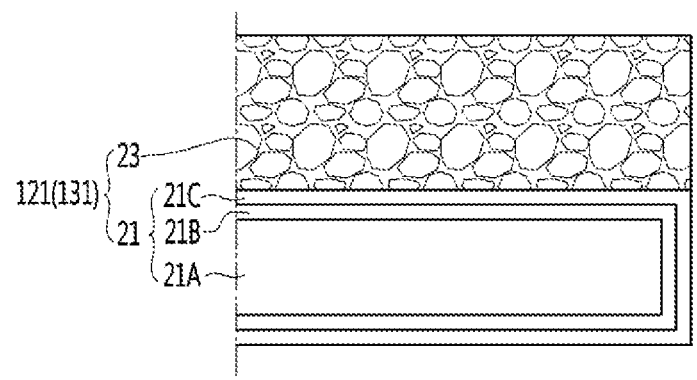
FIG. 5 is a view illustrating a detailed configuration of a frame according to an embodiment.
Figure 6:
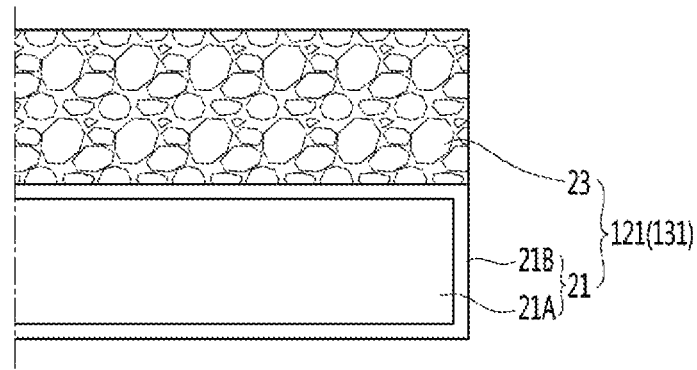
FIG. 6 is another example of a base layer in a detailed configuration of a frame according to an embodiment.

FIG. 1 is a plan view of a device package according to a first embodiment, FIG. 2 is a cross-sectional view taken along the A-A side of the semiconductor device package of FIG. 1, FIG. 3 is a partially enlarged view of FIG. 2, FIG. 4 illustrates an example of a porous metal layer in which a semiconductor device is removed from FIG. 1, FIG. 5 is a view illustrating a detailed configuration of a frame according to an embodiment, and FIG. 6 is another example of a base layer in a detailed configuration of a frame according to an embodiment.

Referring to FIGS. 1 to 3, a semiconductor device package 100 according to an embodiment includes frames 121 and 131 and devices 151 disposed on the frames 121 and 131, and at least one or all of the frames 121 and 131 may include a coupling portion 141 and 143 connected to the device 151. The device 151 may include a light emitting device, a semiconductor device, or another sensing or protection device. For convenience of explanation, the device 151 may be described as an example of a semiconductor device or a light emitting device.

The frames 121 and 131 may be disposed in one or plural and may be conductive materials. The plurality of frames 121 and 131 may include first and second frames 121 and 131 spaced apart from each other. At least one or two of the plurality of frames 121 and 131 may be electrically connected to the semiconductor device 151. The first and second frames 121 and 131 may be spaced apart from each other in a first direction X and may have a length greater than a bottom length of the cavity 112 in a second direction Y.

The plurality of frames 121 and 131 may be coupled to the body 113. The body 113 may be disposed between the first and second frames 121 and 131. The package body 110 may be disposed on the first and second frames 121 and 131 and the body 113. The package body 110 may include the body 113 or may be formed of a separate material. The body 113 may be disposed between the first and second frames 121 and 131, and the first and second frames 121 and 131 may be insulated from each other through the body 113, and may be physically spaced apart from each other. The package body 110 may be coupled with the body 113 and the first and second frames 121 and 131. The package body 110 may include the first and second frames 121 and 131 and the body 113.

The body 113 may be a resin material or an insulating material. The body 113 may be, for example, Polyphthalamide (PPA), Polychloro triphenyl (PCT), liquid crystal polymer (LCP), polyamide 9T (PA9T), silicone, epoxy, epoxy molding compound (EMC), At least one selected from the group consisting of a silicone molding compound (SMC), a ceramic, a photo sensitive glass (PSG), and sapphire ($Al_2O_3$). In addition, the body 113 may include a high refractive filler such as $TiO_2$ and $SiO_2$ in an epoxy material. The body 113 may be a reflective resin material. As another example, the body 113 may be a transparent or non-transparent material. The body 113 may be a ceramic material.

The package body 110 may be the same material as the body 113 or may be another insulating material. The package body 110 may be a transparent or reflective material.

The first frame 121 and the second frame 131 may be separated from each other by the body 113. When the first frame 121 and the second frame 131 are conductive materials or electrodes, the body 113 may be formed of an insulating material as an electrode separation member.

The first frame 121 may include a first extension portion 129 extending to a first side surface of the package body 110, and the first extension portion 129 may protrude into a single piece or a plurality of pieces. An opposite side of the first side of the package body 110 may be a second side. The first frame 121 has at least one opening and/or groove in a region overlapping the package body 110 in a vertical direction, and may be coupled to a portion of the package body 110.

The second frame 131 may include a second extension portion 139 extending to the second side surface of the package body 110 through the package body 110, and the second extension portion 139 may protrude into a single piece or a plurality of pieces. The second frame 131 may include at least one opening and/or groove in a region overlapping the package body 110 in a vertical direction, and may be coupled to a portion of the package body 110.

The package body 110 may include a cavity 112. The cavity 112 may have an upper portion of the package body 110 open, and the first frame 121 and the second frame 131 may be exposed. The cavity 112 may be disposed on the body 113. The frames 121 and 131 may be exposed at the bottom of the cavity 112. The body 113 may be exposed to the bottom of the cavity 112. The side surface 116 of the cavity 112 may include a surface inclined or perpendicular to the bottom surface of the package 100, or a surface perpendicular and an inclined surface. The upper surface shape of the cavity 112 may include a circular shape, an elliptic shape or a polygonal shape. A length of the first and second directions of the cavity 112 may be greater than the length of the first and second directions of the semiconductor device. The second direction Y is a direction perpendicular to the first direction X, and the first direction is a direction from the first frame 121 toward the second frame 131 or a direction the second frame 131 toward the first frame 121. The third direction may be a direction perpendicular to the first and second directions. The third direction Z may be a thickness direction or a vertical direction of the package. The third direction may be a direction from the lower surface of the body 113 toward the upper surface or a direction from the upper surface of the body 113 toward the lower surface.

The frames 121 and 131 may be a conductive material, for example, may include a metal material. The frames 121 and 131 may include a plurality of metal layers.

The semiconductor device 151 may be disposed on at least one or both of the first and second frames 121 and 131. The semiconductor device 151 may be electrically connected to the first and second frames 121 and 131. The semiconductor device 151 may overlap the first and second frames 121 and 131 in a third direction. Electrodes P5 and P6 may be disposed under the semiconductor device 151, and the electrodes P5 and P6 may include a first electrode P5 and a second electrode P6. The first electrode P5 may face the first frame 121, and the second electrode P6 may face the second frame 131. The electrodes P5 and P6 of the semiconductor device 151 may be connected to the first frame 121 and the second frame 131 through the coupling portions 141 and 143 and may provide power. The first electrode P5 may include a first coupling portion 141. The second electrode P6 may include a second coupling portion 143. The first and second electrodes P5 and P6 may have a structure protruding downward from the semiconductor device 151. The first and second electrodes P5 and P6 may function as coupling portions or pads bonded to the frames 121 and 131 under the semiconductor device 151.

When the semiconductor device 151 is a light emitting device, the light emitting device may be formed of a compound semiconductor of group II and group VI elements, and/or a compound semiconductor of group III and group V elements. For example, the light emitting device may selectively include a semiconductor device manufactured using a compound semiconductor of a series such as AlInGaN, InGaN, AlGaN, GaN, GaAs, InGaP, AlInGaP, InP, and InGaAs. The light emitting device may emit light such as red, green, blue, ultraviolet light, white, and infrared light. One or more light emitting devices may be disposed on the frames 121 and 131. One or more light emitting devices may be disposed in the cavity 112. The electrodes P5 and P6 may be disposed under the semiconductor device 151, and the electrodes P5 and P6 may include pads.

As illustrated in FIG. 2, the frames 121 and 131 according to the embodiment may include a plurality of pores 20. The plurality of pores 20 may be formed on or partially formed on the frames 121 and 131. Alternatively, a thin film including the plurality of pores 20 and a thin film not including the plurality of pores 20 may be coupled. The frames 121 and 131 may include a lower layer 21 and a first metal layer 23 having a plurality of pores 20 on the lower layer 21. The first metal layer 23 may be defined as a porous layer, a porous metal layer, or a porous conductive layer.

The lower layer 21 may include a metal, for example, at least one of platinum (Pt), titanium (Ti), nickel (Ni), copper (Cu), gold (Au), tantalum (Ta), aluminum (Al), and silver (Ag). The lower layer 21 may be a single layer or a multilayer having different metal layers. As shown in FIG. 5, the lower layer 21 may include a base layer 21A, an adhesive layer 21B on the base layer 21A, and a protective layer 21C on the adhesive layer 21B. The base layer 21A may include a metal of Cu or a thermally conductive material. The base layer 21A may have a thickness of 220 µm or less, for example, in a range of 180 µm to 220 µm. The base layer 21A may improve thermal conductivity and electrical conductivity in the frame. When the thickness of the base layer 21A is thinner than the above range, bending or cracking may occur during injection molding with the package body 110, and heat dissipation may be degraded. The lower layer 21 may be a lead electrode or a lead frame. The frames 121 and 131 having the lower layer 21 and the first metal layer 23 may be lead electrodes or lead frames. Although the lower layer 21 and the first metal layer 23 are defined as one frame, the lower layer 21 may be divided into a lead frame and the first metal layer 23 may be divided into a porous metal layer.

The adhesive layer 21B is bonded to the base layer 21A to form the protective layer 21C, and may include, for example, at least one of Ni, Ti, Cr, and Pd. The protective layer 21C may be a layer for preventing the external surface from being oxidized, and may be formed of, for example, Ag or Au. The protective layer 21C and the adhesive layer 21B may have a thickness ranging from 100 nm to 500 nm. The protective layer 21C and the adhesive layer 21B may improve adhesion to other layers and protect the surface of the lower layer 21.

The first metal layer 23 may be bonded or bonded to the protective layer 21C of the lower layer 21. The first metal layer 23 may be electrically connected to the lower layer 21, and may be bonded to each other or integrally bonded to each other. The first metal layer 23 may include at least one of Cu, Au, Ag, Al, or an alloy having at least one of the metals.

As shown in FIG. 6, the lower layer 21 may have a base layer 21A and an adhesive layer 21B, and the adhesive layer shown in FIG. 5 is removed. The first metal layer 23 may be bonded or bonded to the adhesive layer 21B of the lower layer 21.

Figure 7:
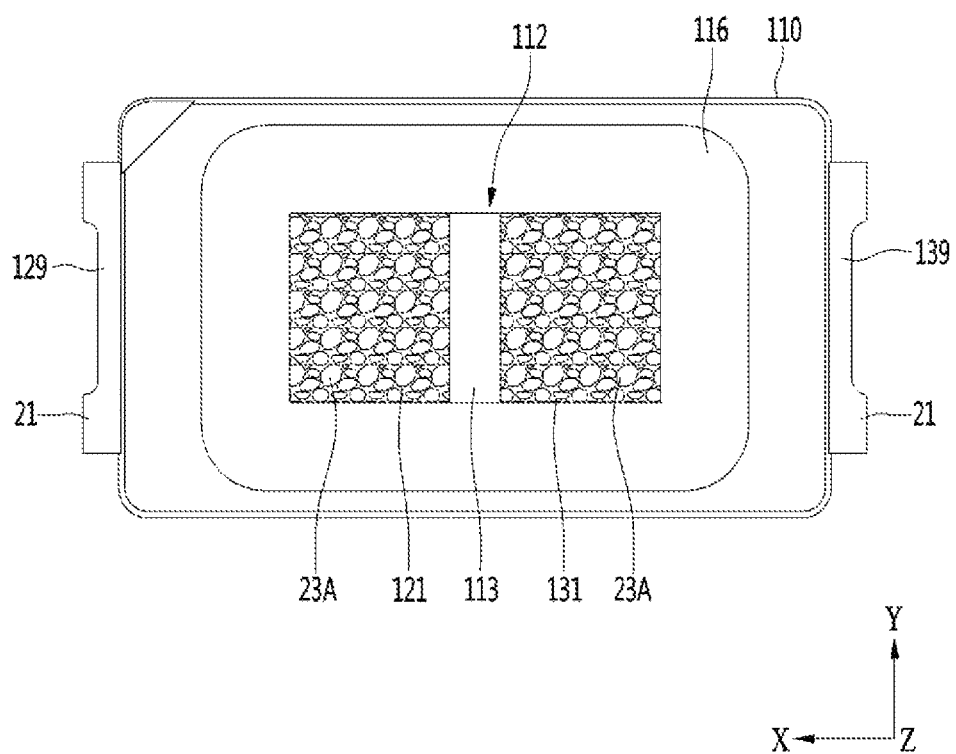
FIG. 7 is a first modified example of a frame in the semiconductor device package of FIG. 1.

The first metal layer 23 of the frames 121 and 131 may be formed on the entire upper surface of the frames 121 and 131 or in some regions. Since the first metal layer 23 is stacked on the lower layer 21, the first metal layer 23 may be laminated on the entire upper surface region of the lower layer 21 or may be laminated on the partial region. As illustrated in FIG. 7, for example, the first metal layer 23A may be disposed at the bottom of the cavity 112 and may not be provided at an outer region of the package body 110. Accordingly, adhesion between the package body 110 and the frames 121 and 131 may be improved, and the first metal layer 23A may be protected. Since the first metal layer 23A is in contact with the body 113, an adhesion area of the body 113 may be increased.

Figure 10:
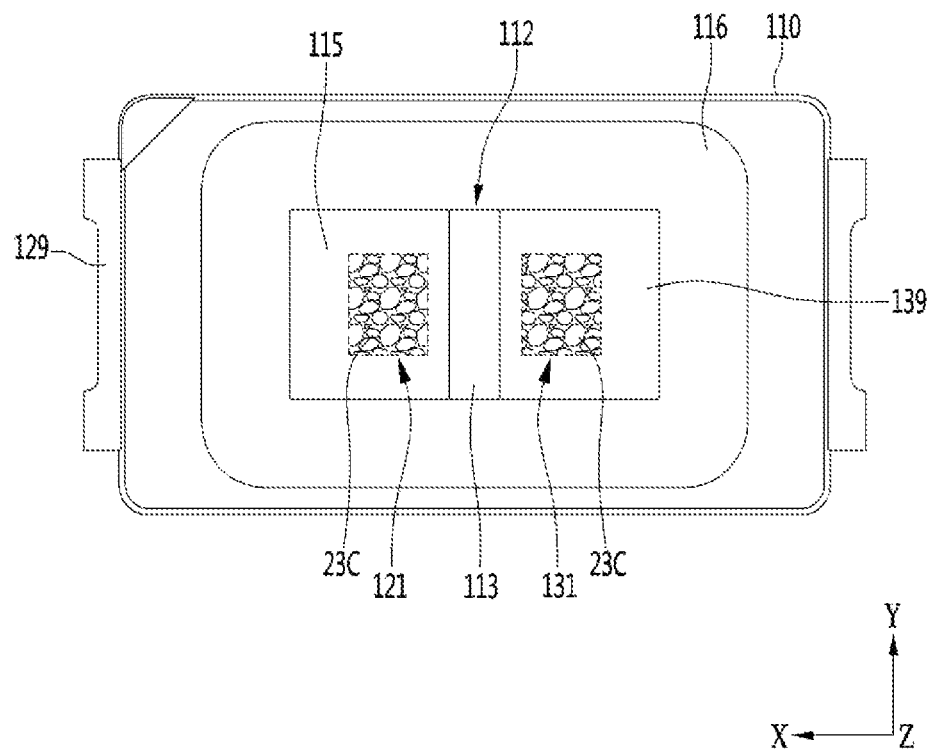
FIG. 10 is a second modified example of a frame in the device package of FIG. 1.

As illustrated in FIG. 10, the first metal layer 23C may be disposed in a region overlapping with the semiconductor device 151, for example, a light emitting device or a region in which the semiconductor device is disposed. In the region where the first metal layer 23C and the semiconductor device 151 do not overlap, the lower layer 21 may be exposed, formed of a material of the body 113, or formed of another material. The lower layer 21, which does not overlap the semiconductor device 151, may be exposed on the bottom of the cavity 112. Since the first metal layer 23C may be disposed in a portion of the lower layer 21 of the first and second frames 121 and 131 and may be spaced apart from an edge of the cavity 112, the first metal layer 23C may be protected and the light loss in the cavity 112 may be reduced.

At least one or both of an opening or a groove may be disposed in the first and second frames 121 and 131. One or more openings or grooves may be disposed. A material of the body 113 or the package body 110 may be coupled to at least one of the opening and the groove. At least one of the openings and the grooves may be used to support the frames 121 and 131 and to strengthen the coupling with the frames 121 and 131 disposed on the bottom of the package body 110.

As illustrated in FIGS. 3 and 4, the first metal layer 23 disposed on the frames 121 and 131 may include a plurality of pores 20. The pores 20 may be arranged to be connected to each other or spaced apart from each other. The pores 20 may have a diameter or width of 1 nm or more, for example, may include a range of 1 nm to 500 nm. The pore 20 may have a non-uniform size or a uniform size. The pores 20 may be connected to each other, so that the first metal layer 23 may be formed in a three-dimensional shape in the form of a net (mesh). That is, adjacent pores among the pores 20 may be connected to each other, and the pore size connected to each other may be larger. The diameter or width of the connected pores 20 may be at least 1 nm or at most 500 nm or less. The pores 20 may be included in the frames 121 and 131. The pores 20 may be disposed on an upper layer among the layers of the frames 121 and 131. The pores 20 may be disposed in an area facing the electrodes P5 and P6 of the semiconductor device 151 on the frames 121 and 131. The pores 20 may overlap with the electrodes P5 and P6 of the semiconductor device 151 in the vertical direction on the frames 121 and 131.

The first metal layer 23 may have a thickness equal to or smaller than that of the lower layer 21. The thickness of the first metal layer 23 may be in a range of ½ to ⅙ of the thickness of the frames 121 and 131, and may be combined with the coupling portions 141 and 143 in this thickness range. The porous first metal layer 23 may be provided at a thickness less than or equal to the thickness of the lower layer 21 because the thermal and electrical conductivity is lower than that of the lower layer 21. By the porous first metal layer 23, degradation of thermal and electrical conductivity of the frames 121 and 131 may be minimized.

The coupling portions 141 and 143 may be disposed in the pores 20 of the frames 121 and 131. The coupling portions 141 and 143 may be electrically connected to each other by bonding the semiconductor device 151 and the frames 121 and 131. The coupling portions 141 and 143 may be formed by diffusing a metal material included in the semiconductor device 151 into the first metal layer 23. For example, when the material diffused into the first metal layer 23 is Sn and the material constituting the first metal layer 23 is a material of Au, Ag, Cu, or Al, the coupling portions 141 and 143 may include at least one of AgSn, AuSn, and CuSn. The coupling portions 141 and 143 may be disposed in a region close to the upper surface of the first metal layer 23 or in the upper surface of the first metal layer 23. The coupling portions 141 and 143 may include at least one of metals constituting the first metal layer 23. The coupling portions 141 and 143 may overlap the first and second electrodes P5 and P6 in a vertical direction. The coupling portions 141 and 143 may be disposed between an upper surface of the first and second electrodes P5 and P6 and a lower surface of the first metal layer 23. Accordingly, the coupling portions 141 and 143 may be formed between the first metal layer 23 and the electrodes P5 and P6 of the semiconductor device 151 and may be disposed close to the upper surface of the first metal layer 23. The coupling portions 141 and 143 may be disposed on an upper portion of each of the frames 121 and 131 or in the first metal layer 23 of each of the frames 121 and 131.

Upper surfaces of the coupling portions 141 and 143 may be smaller than upper surfaces of the first metal layer 23. Upper surface areas of the coupling portions 141 and 143 may be smaller than upper surface areas of the frames 121 and 131. Upper surfaces of the coupling portions 141 and 143 may be larger than lower surfaces of the first and second electrodes P5 and P6.

The coupling portions 141 and 143 may be defined as an intermetallic compound (IMC) layer or an intermetallic compound region. Melting points of the coupling portions 141 and 143 may be higher than a temperature of heat used in the process in which the semiconductor device package 100 is disposed on the circuit board 201 or another supporting member shown in FIG. 26. Accordingly, during the process of bonding the semiconductor device package 100 on the circuit board in FIG. 26 or another supporting member, a bonding portion between the semiconductor device package 100 and the semiconductor device 151 may be prevented from the re-melting.

The coupling portions 141 and 143 may include at least one of metals constituting the frames 121 and 131. The coupling portions 141 and 143 may include at least one of metals constituting the first metal layer 23 of the frames 121 and 131. The coupling portions 141 and 143 may include at least one of metals forming the electrodes P5 and P6 of the semiconductor device 151. The coupling portions 141 and 143 may be a compound having at least one of metals constituting the electrodes P5 and P6 of the semiconductor device 151 and at least one of metals constituting the first metal layer 23. The coupling portions 141 and 143 may be compounds of at least one of the metals constituting the first metal layer 23 and another metal.

The electrodes P5 and P6 of the semiconductor device 151 include at least one of Ti, Cr, Ni, Sn, In, Pd, Cu, or Ag, and may be a single layer or a multilayer. The electrodes P5 and P6 of the semiconductor device 151 may include a stacked structure of Ag/Sn, Cu/Sn, Ag/In, Cu/In, or Cu/Ni from a lower layer. The electrodes P5 and P6 of the semiconductor device 151 may include an alloy having at least one of the above metals.

The first metal forming the coupling portions 141 and 143 may be at least one of Ag, Cu, Au, Cu, and Al, and the second metal may include at least one of Sn, In, and Ni. The coupling portions 141 and 143 may include any one of an Ag—In based compound, a Cu—Sn based compound, an Ag—Sn based compound, an Au—Sn based compound, and a Cu—Ni based compound. The coupling portions 141 and 143 may include, for example, at least one of $Ag_xIn_y$, $Cu_xSn_y$, $Ag_xSn_y$, $Au_xSn_y$, $Cu_xNi_y$, and $Al_xSn_y$, where it has a relationship of x is 0<x<1 and y=1-x. The first metal of the coupling portions 141 and 143 may be at least one of Ag, Cu, Au, Cu, and Al, and the second metal may include at least one of Sn, In, and Ni. When the amount of the first metal in the coupling portions 141 and 143 is too large, the temperature for forming the coupling portions 141 and 143 becomes high, so that the coupling portions 141 and 143 between the semiconductor device 151 and the semiconductor device package 100 are increased. It may be difficult to construct. In this case, the larger the amount of the first metal, the higher the melting point of the coupling portions 141 and 143 may reduce the re-melting problem between the semiconductor device 151 and the semiconductor device package 151. If the amount of the second metal is too large, the temperature for forming the coupling portions 141 and 143 becomes low, so it may be easy to configure the coupling portions 141 and 143 between the semiconductor device 151 and the semiconductor device package 100. In this case, as the amount of the second metal increases, the melting point of the coupling portions 141 and 143 may be lowered, and the re-melting problem between the semiconductor device 151 and the semiconductor device package 100 may increase. The mass percentage of the first and second metals may be adjusted in consideration of adhesion or re-melting.

Here, the low temperature bonding for the coupling portions 141 and 143 may be bonded, for example, at a temperature of 250° C. or less. For example, a bonding process by the solder paste of the comparative example may be performed at 280° C. to 320° C., thereby causing a problem of re-melting in the reflow process of the semiconductor device package 100. That is, the melting point of the coupling portions 141 and 143 may be determined by the temperature of the heat used in the process of bonding the semiconductor device package 100 on the circuit board 201 or another supporting member shown in FIG. 26. The coupling portion between the semiconductor device 100 and the semiconductor device may be prevented from being re-melted.

Since the first metal layer 23 of the frames 121 and 131 has a plurality of pores 20, when the package body 110 and the body 113 are injection molded, a portion of 110 may be filled in the pores 20 as shown in FIG. 2. Since the first metal layers 23 of the frames 121 and 131 contact each other in a region overlapping the package body 110 in the vertical direction, a portion of the package body 110 may be disposed in the pores 20. That is, the lower portion of the package body 110 may be disposed lower than the upper surface of the first metal layer 23.

The molding portion 181 may be disposed in the cavity 112. The molding portion 181 may include a transparent resin material. The molding portion 181 may include a material such as transparent silicone or epoxy. The molding portion 181 may be disposed on the body 113 and the frames 121 and 131. The molding portion 181 may cover the semiconductor device 151. The molding portion 181 may transmit the light emitted from the semiconductor device 151. The molding portion 181 may be disposed in a single layer or multiple layers, and in the case of the multiple layers, a resin materials having a lower refractive index toward the upper surface of the molding portion 181 may be disposed. The package body 110 and the cavity 112 may be removed. In this case, the molding portion 181 may be provided to cover the semiconductor device 151 and the body 113.

The molding portion 181 may include a phosphor therein. The phosphor may include at least one of red, green, yellow, and blue phosphors. The upper surface of the molding portion 181 may be a horizontal plane, or may include at least one of a concave curved surface or a convex curved surface. An optical lens (not shown) may be disposed on the molding portion 181, and the optical lens may adjust the directivity of light emitted through the molding portion 181. The light emitted through the molding portion 181 may be visible light such as red, green, yellow, blue, white or infrared light, but is not limited thereto. The molding portion 181 may not be formed, but is not limited thereto.

Here, the molding portion 181 covering the cavity 112 may be in contact with the pores 20 of the first metal layer 23 of the frames 121 and 131, or another resin material may be in contact. Since the molding portion 181 or another resin material filled in the cavity 112 is filled in a liquid state, it may be filled in the pores 20. That is, the molding portion 181 or the lower portion of the resin material may be lower than the upper surface of the first metal layer 23.

Here, the first and second frames 121 and 131 may include a resin of reflective material. The resin of the reflective material may be a material different from that of the molding portion 181. The resin of the reflective material may be in contact with the molding portion 181. The resin of the reflective material may contact the electrodes P5 and P6 and the first metal layer 23C. The resin of the reflective material may be disposed between the semiconductor device 151 and the body 113. The resin of the reflective material may diffuse the incident light. The resin of the reflective material may attach the semiconductor device 151 to the body 113. The resin of the reflective material may prevent tilting or flow of the semiconductor device 151 when bonding the electrode of the semiconductor device 151 or reflowing a package under the semiconductor device 151. Therefore, the reliability of the semiconductor device 151 and the package having the same may be improved. The resin of the reflective material may be disposed in the pores or disposed on the first metal layer 23A.

As shown in FIG. 3, the bottom width B1 or bottom area of the electrodes P5 and P6 of the semiconductor device 151 may be smaller than the bottom width B2 or bottom area of the intermetallic compound layer. The contact area may be increased by the coupling portions 141 and 143 which provide a wider width or area than the electrodes P5 and P6 of the semiconductor device 151, and the electrodes P5 and P6 of the semiconductor device 151 and the frame 121 and 131 may be effectively connected.

As shown in FIGS. 2 and 4, the first metal layer 23 of the frames 121 and 131 may be further disposed on the extension portions 129 and 139 of the frames 121 and 131. In this case, when bonding the semiconductor device package 100, the adhesive force with the bonding material may be improved by the first metal layer 23.

Figure 8:
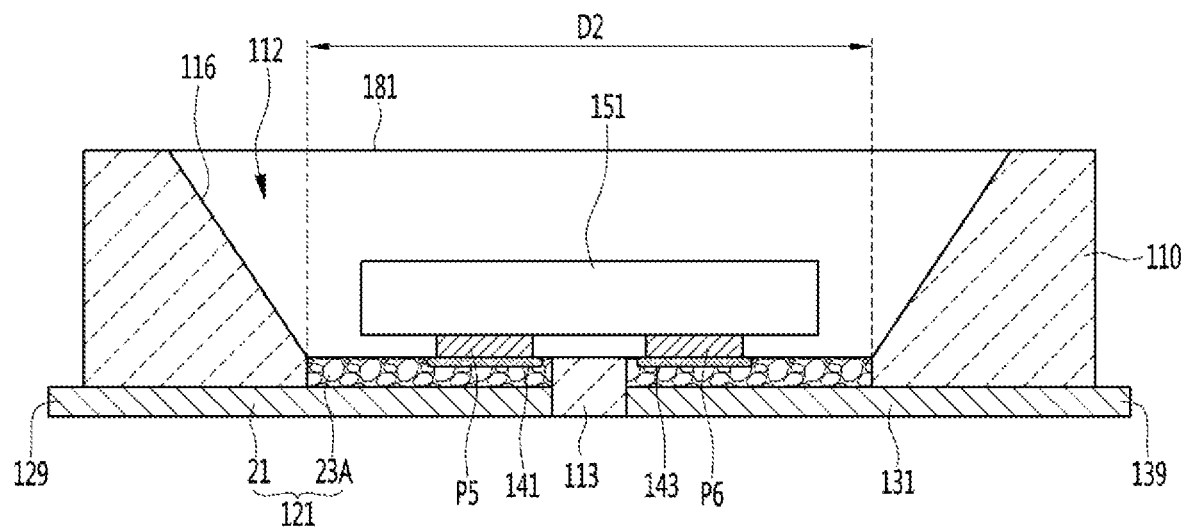
FIG. 8 is a first modified example of the semiconductor device package having the frame of FIG. 7.

Referring to FIGS. 7 and 8, the first modified example of the semiconductor device package will be described. The first metal layer 23A is removed from the extension portions 129 and 139 of the first frame 121, and the second frame 131 is removed. The first metal layer 23A may be removed from the extension portion 139.

The first metal layer 23A of the frames 121 and 131 may be disposed on the frames 121 and 131 overlapping the cavity 112 in a vertical direction, for example, disposed on the lower layer 21. Accordingly, since the porous first metal layer 23A is disposed at the bottom of the cavity 112 and does not overlap the package body 110 or is exposed to the outside, the first metal layer 23A may be protected and the first metal layer 23A may be protected. The penetration of moisture through the metal layer 23A may be prevented, and the coupling between the package body 110 and the frames 121 and 131 may be strengthened.

In addition, since the coupling portions 141 and 143 are bonded at a low temperature in the first metal layer 23A to connect the electrodes P5 and P6 of the semiconductor device 151 to the frames 121 and 131, the re-melting problem may be solved.

On each of the frames 121 and 131, the first metal layer 23A may be disposed to have a length smaller than the bottom length of the cavity 112 in the first direction and contact the side surface of the cavity 112. Accordingly, a portion of the side surface of the cavity 112 may be disposed in the pores of the first metal layer 23A, so that the floating of the first metal layer 23A may be suppressed.

Figure 9:
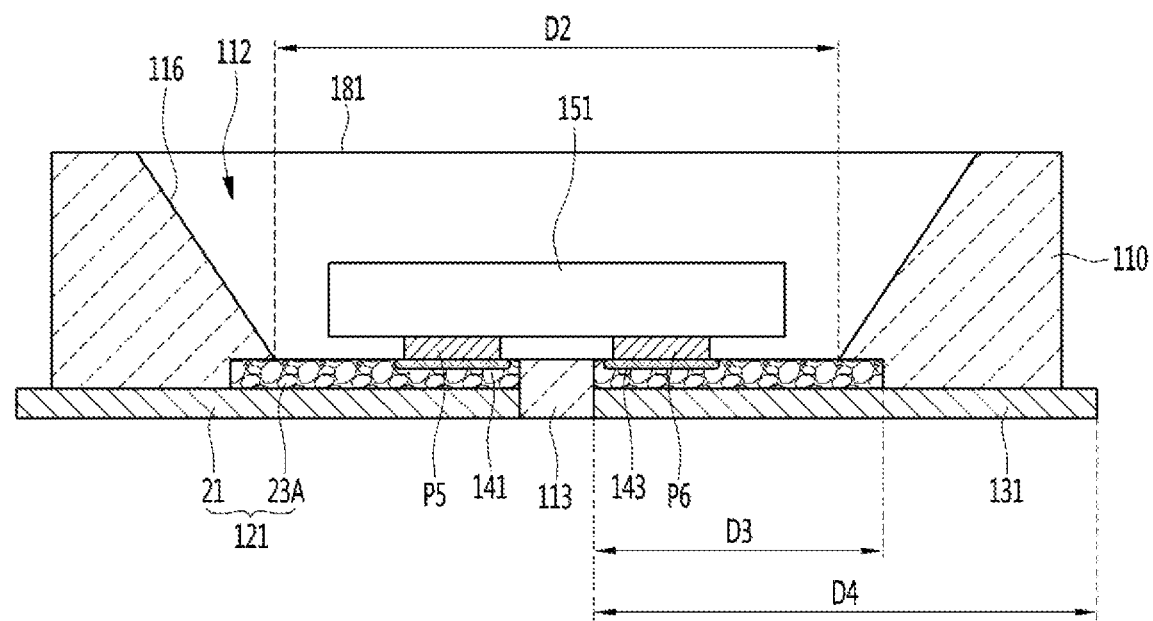
FIG. 9 is a second modified example of the semiconductor device package having the frame of FIG. 7.

Referring to FIGS. 7 and 9, a portion of the first metal layer 23A of the first and second frames 121 and 131 may overlap the package body 110 in the vertical direction. The distance between both ends of the first metal layer 23A of the first and second frames 121 and 131 may be wider than a bottom length D2 of the cavity 112. The width D3 of the first metal layer 23A may be smaller than the width D4 of the first and second frames 121 and 131. Since the first metal layer 23A is disposed between the package body 110 and the lower layer 21 in the package body 110, the bonding force with the package body 110 may be enhanced. The first metal layer 23A may be defined separately from the frames 121 and 131, and in this case, the frames 121 and 131 may be the lower layers 21 of FIGS. 5 and 6. In this case, the first metal layer 23A may be disposed between the first and second frames 121 and 131 and the electrodes P5 and P6.

The first metal layer 23A may be in contact with the body 113. The first metal layer 23A may be in contact with the package body 110. An outer portion of the first metal layer 23A may overlap the package body 110 in a vertical direction. The body 113 may be disposed between the first metal layers 23A on the first and second frames 121 and 131. The thickness of the body 113 may be an interval from an upper surface of the first metal layer 23A to a lower surface of the first and second frames 121 and 131. The upper surface area of the first metal layer 23A may be smaller than the lower surface area of each of the first and second frames 121 and 131. The coupling portions 141 and 143 may be formed on the first metal layer 23A and refer to the description disclosed above.

Here, the first and second frames 121 and 131 may include a resin of reflective material. The resin of the reflective material may be disposed between the semiconductor device 151 and the body 113. The resin of the reflective material may be a material different from that of the molding portion 181. The resin of the reflective material may be in contact with the molding portion 181. The resin of the reflective material may contact the electrodes P5 and P6 and the first metal layer 23A.

Figure 11:
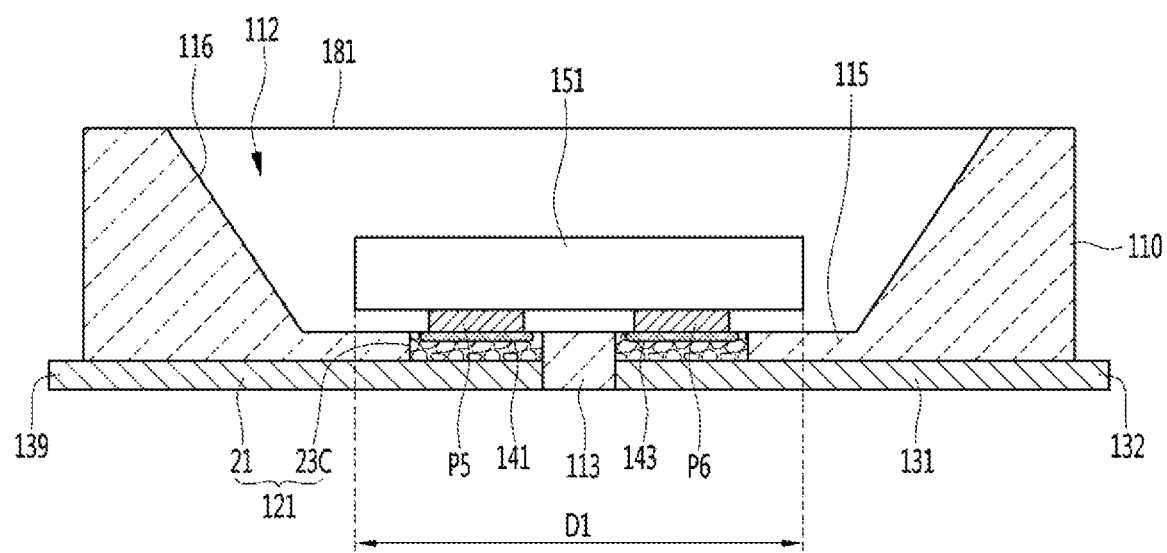
FIG. 11 is a third modified example of the semiconductor device package having the frame of FIG. 10.

Referring to FIGS. 10 and 11, the lower layers 21 of the first and second frames 121 and 131 overlaps the semiconductor device 151 in a vertical direction and is disposed below a region of the semiconductor device 151. The lower layers 21 of the first and second frames 121 and 131 may be spaced inward from the side surfaces of the semiconductor device 151. The lower layers 21 of the first and second frames 121 and 131 may be spaced apart from edges of the bottom of the cavity. A portion 115 of the body 113 may be disposed around the lower layer 21. A portion 115 of the body 113 may be disposed on the first and second frames 121 and 131 and exposed to the bottom of the cavity. A portion 115 of the body 113 may be disposed around the bottom of the semiconductor device 151. A portion 115 of the body 113 may reflect light incident from the lower circumference of the semiconductor device 151. A portion 115 of the body 113 may overlap the semiconductor device 151 in the vertical direction. Therefore, since the lower layer 21 is disposed in a region overlapping the semiconductor device 151 in the vertical direction, the loss of light emitted from the semiconductor device 151 may be reduced.

The upper surface area of the first metal layer 23C of the first and second frames 121 and 131 may be smaller than the lower surface area of the semiconductor device 151. Accordingly, the decrease in the reflection efficiency of the side light of the semiconductor device 151 due to the first metal layer 23C may be prevented. The first metal layer 23C may prevent a decrease in reflection efficiency of side light of the semiconductor device 151.

The first metal layer 23C may be disposed under the electrodes P5 and P6 of the semiconductor device 151. The first metal layer 23C may be disposed around the electrodes P5 and P6. Accordingly, the coupling portions 141 and 143 may be provided under the electrodes P5 and P6. A sum of the upper surface areas of the first metal layers 23C of the first and second frames 121 and 131 may be smaller than the bottom surface area of the semiconductor device 151. The sum of the upper surface areas of the first metal layers 23C of the first and second frames 121 and 131 may be equal to or larger than the sum of the bottom areas of the electrodes P5 and P6.

In the first and second frames 121 and 131, the thickness of the region where the first metal layer 23C is disposed may be greater than the thickness of the region where the first metal layer 23C is not present. The first metal layer 23C may protrude in a stepped structure from the upper portions of the first and second frames 121 and 131.

A portion 115 of the body 113 may extend on the bottom of the cavity 112 to contact the side surface of the first metal layer 23C. A portion 115 of the body 113 may extend from the package body 110 toward the semiconductor device 151. A portion 115 of the body 113 may be a portion of the package body 110. The upper surface of the first metal layer 23C may be disposed on the same horizontal surface as the upper surface of the body 113. The upper surface of the first metal layer 23C may be disposed on the same horizontal surface as the upper surface of the portion 115 of the body 113.

As another example, the first metal layer 23C may be defined separately from the frames 121 and 131. In this case, the frames 121 and 131 may be the lower layers 21 of FIGS. 5 and 6. The coupling portions 141 and 143 may be formed on the first metal layer 23C and refer to the description disclosed above.

Here, the first and second frames 121 and 131 may include a resin of reflective material. The resin of the reflective material may be disposed between the semiconductor device 151 and the body 113. The resin of the reflective material may be a material different from that of the molding portion 181. The resin of the reflective material may be in contact with the molding portion 181. The resin of the reflective material may contact the electrodes P5 and P6 and the first metal layer 23C.

Figure 12:
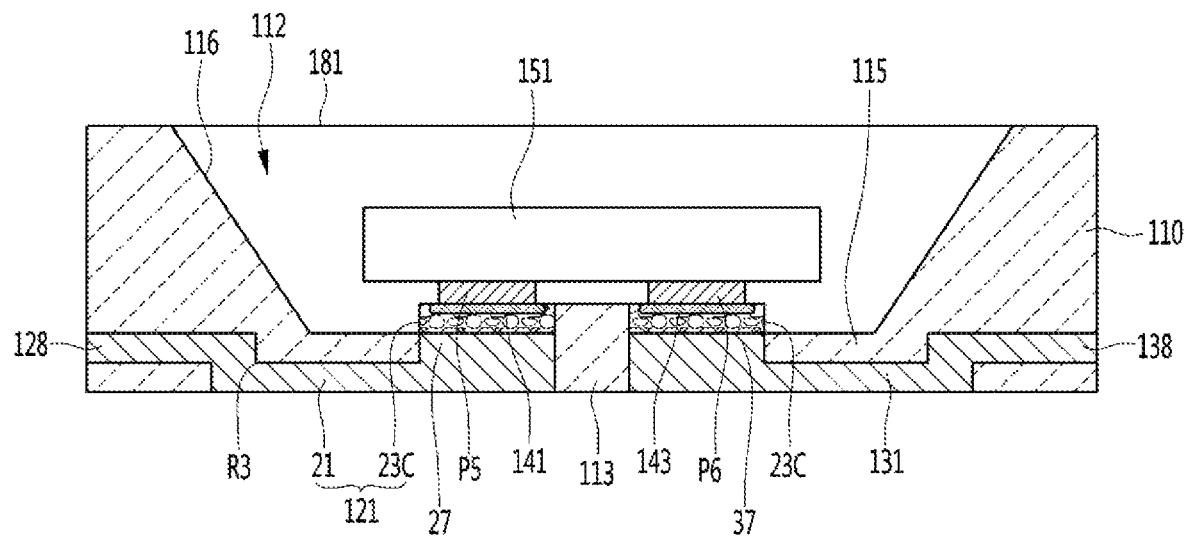
FIG. 12 is a fourth modified example of the semiconductor device package having the frame of FIG. 10.

Referring to FIGS. 10 and 12, the frames 121 and 131 may have protrusions 27 and 37, and the protrusions 27 and 37 are stepped portions, and may be protruded portions corresponding to the semiconductor devices 151. The protrusions 27 and 37 may overlap the semiconductor device 151 in the vertical direction. The protrusions 27 and 37 may overlap with the electrodes P5 and P6 of the semiconductor device 151 in the vertical direction. The protrusions 27 and 37 may be spaced apart from a bottom edge of the cavity. The protrusions 27 and 37 may be in contact with the body 113 and a portion 115 of the body 113. Upper surfaces of the protrusions 27 and 37 may be disposed to be the same as or lower than the upper surface of the body 113.

The porous first metal layer 23C may be disposed on the protrusions 27 and 37 of the frames 121 and 131. The first metal layer 23C may be formed separately from the frames 121 and 131, and in this case, the frames 121 and 131 may be the lower layers 21 of FIGS. 5 and 6.

The first and second frames 121 and 131 may include a stepped recess region R3 on the outside of the protrusions 27 and 37. A portion 115 of the body 113 or the package body 110 may be disposed in the recess region R3. A portion 115 of the package body 110 extends to the bottom of the cavity 112 to surround the protrusions 27 and 37 of the frames 121 and 131. In this case, the porous first metal layer 23C may be disposed at a position higher than the bottom of the cavity 112. The first metal layer 23C may be connected to the electrodes P5 and P6 of the semiconductor device 151. The coupling portions 141 and 143 may be formed on the first metal layer 23C, and the description thereof will be referred to.

The coupling portions 141 and 143 may overlap the first metal layer 23C in the vertical direction. The coupling portions 141 and 143 may be disposed between the first metal layer 23C and the electrodes P5 and P6, respectively. The coupling portions 141 and 143 may overlap the protrusions 27 and 37 in the vertical direction. The coupling portions 141 and 143 may be disposed above the protrusions 27 and 37. The coupling portions 141 and 143 may be disposed above the upper surface of the body 113 or lower than the upper surface of the body 113. That is, the first metal layer 23C may be separately formed on each of the frames 121 and 131, and the upper surface of the body 113 may be disposed at or below the upper surface of the first metal layer 23C.

The coupling portions 141 and 143 and the first metal layer 23C may be disposed above the upper surface of the portion 115 of the body 113. The first and second frames 121 and 131 may have a thickness equal to or greater than a thickness of another region in which the metal layer 23C is disposed.

The extension portions 128 and 138 of the frames 121 and 131 may be bent from the frame and spaced apart from the bottom of the package body 110, and may be exposed to the side of the package body 110 or may protruded through the side of the package body 110.

Here, the first and second frames 121 and 131 may include a resin of reflective material. The resin of the reflective material may be disposed between the semiconductor device 151 and the body 113. The resin of the reflective material may be a material different from that of the molding portion 181. The resin of the reflective material may be in contact with the molding portion 181. The resin of the reflective material may contact the electrodes P5 and P6 and the first metal layer 23C.

Figure 13:
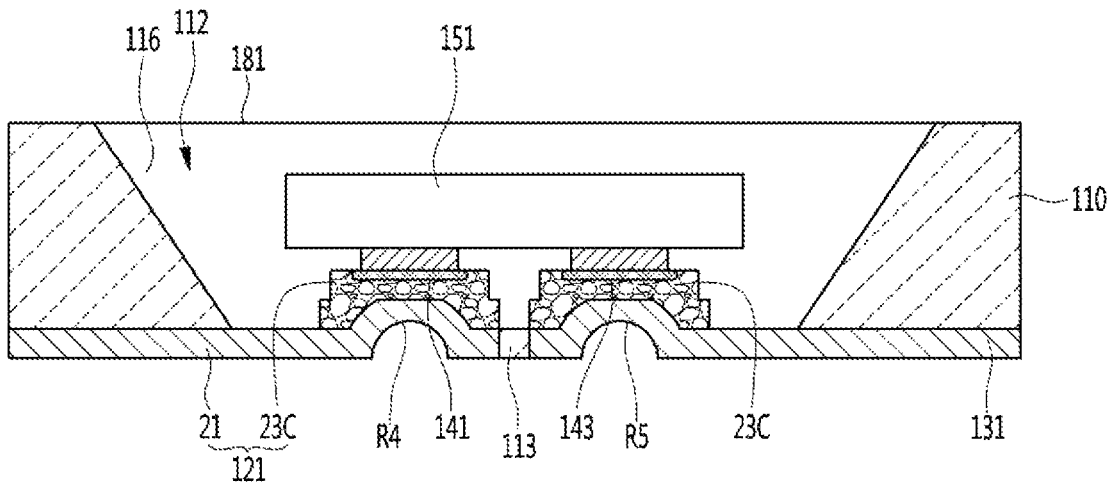
FIG. 13 is a fifth modified example of a modified frame in the semiconductor device package of FIG. 2.

Referring to FIG. 13, the frames 121 and 131 may include convex portions R4 and R5, and the convex portions R4 and R5 may have a shape having a flat upper surface and a curved surface. As another example, the convex portions R4 and R5 may have a curved upper surface. The convex portions R4 and R5 may protrude convexly in the direction of the upper surface from the lower surfaces of the frames 121 and 131. The convex portions R4 and R5 may include a concave recessed region at a lower portion thereof. The recessed region may have an improved bonding area with the conductive member when the semiconductor device package is bonded to the circuit board.

The porous first metal layer 23C is disposed on the convex portions R4 and R5, and the coupling portions 141 and 143 are formed to the porous first metal layer 23C, and the first metal layer 23C and the coupling portion 141 and 143 may connected the electrodes P5 and P6 of the semiconductor device 151 to the frames 121 and 131. The first metal layer 23C may be disposed under a region overlapping the semiconductor device 151 in the vertical direction, and the lower layer 21 may be exposed in other regions.

The coupling portions 141 and 143 and the first metal layer 23C may overlap the convex portions R4 and R5 in the vertical direction. The first metal layer 23C may be plated or deposited separately on the convex portions R4 and R5 of the first and second frames 121 and 131. The first metal layer 23C may be spaced apart from the bottom edge of the cavity. The first metal layer 23C may be disposed under the semiconductor device 151 or may overlap the semiconductor device 151 in a vertical direction. In this case, the upper surfaces of the first and second frames 121 and 131 or the outer surface of the first metal layer 23C may be exposed around the bottom of the semiconductor device 151. The first metal layer 23C may face the side surface 116 of the cavity 112.

Here, a region between the first metal layers 23C of the first and second frames 121 and 131 may include a resin of a reflective material. The resin of the reflective material may be disposed between the semiconductor device 151 and the body 113. The resin of the reflective material may be a material different from that of the molding portion 181. The resin of the reflective material may be in contact with the molding portion 181. The resin of the reflective material may contact the electrodes P5 and P6 and the first metal layer 23C. The resin of the reflective material may prevent the semiconductor device 151 from flowing or tilting.

The body 113 may be disposed between the convex portions R4 and R5 of the first and second frames 121 and 131. The upper surface of the body 113 may be lower than the upper surfaces of the convex portions R4 and R5. The body 113 may or may not be in contact with the first metal layer 23C.

The first metal layer 23C may be disposed on the upper surfaces of the convex portions R4 and R5, and the outer side of the first metal layer 23C may be formed on a flat frames 121 and 131 around the convex portions R4 and R5 or may be formed on the lower layer.

Figure 14:
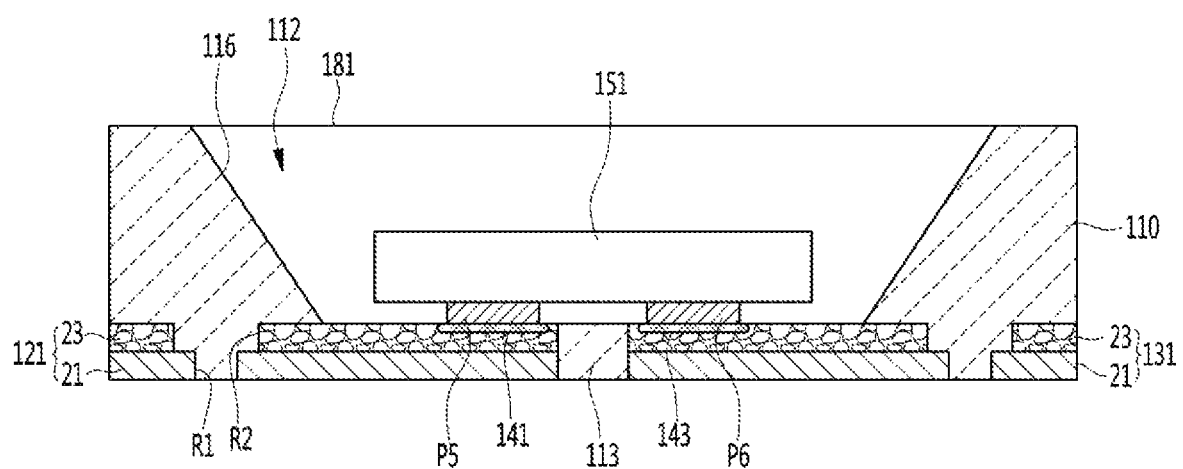
FIG. 14 is a sixth modified example of the semiconductor device package according to the embodiment.

Referring to FIG. 14, openings R1 and R2 are disposed in at least one of the frames 121 and 131, and the openings R1 and R2 may have different sizes of an openings R2 of the lower layer 21 and an opening R1 of the first metal layer 23. For example, the size of the opening R2 of the first metal layer 23 may be larger than the size of the opening R1 of the lower layer 21. The size of the opening R1 of the lower layer 21 may prevent the lower layer 21 from warping. The lower layer 21 may block the exposure of the first metal layer 23 on the opening R1 and may protect the first metal layer 23. The openings R1 and R2 of the frames 121 and 131 may be disposed in a region overlapping the package body 110 in the vertical direction, so that a portion of the package body 110 may protrude through the openings R1 and R2.

The openings R1 and R2 may overlap with the package body 110 in the vertical direction and may be spaced apart from side surfaces of the package body 110. The hole formed by the openings R1 and R2 may be provided in a shape having a wide top and a narrow bottom. At least one or both of the openings R1 and R2 may be disposed in one or a plurality of the first and second frames 121 and 131.

Figure 15:
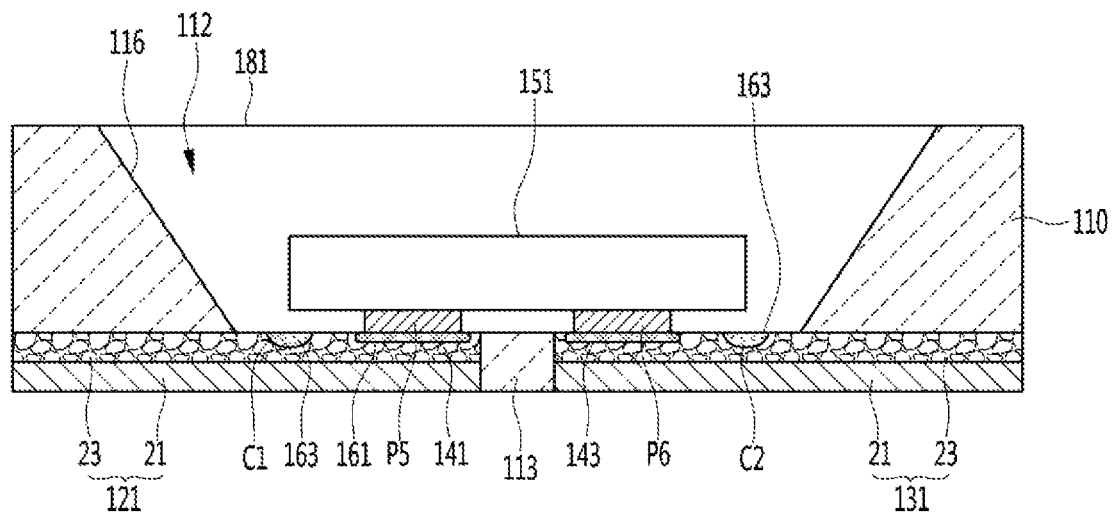
FIG. 15 is a seventh modified example of the semiconductor device package according to the embodiment.

Referring to FIG. 15, at least one of the frames 121 and 131 includes grooves C1 and C2 on the first metal layer 23, and the depths of the grooves C1 and C2 may have a depth smaller than the thickness of the first metal layer 23. The grooves C1 and C2 may be disposed longer than the length or width of the semiconductor device 151, and the width of the grooves C1 and C2 is 30% or more of the width of the electrodes P5 and P6, for example, in the range of 30% to 70% of the width of the electrodes P5 and P6. A reflective portion 163 of a resin material may be disposed in the grooves C1 and C2, and the reflective portion 163 may reflect light emitted in a lateral direction of the semiconductor device 151.

The reflective portion 163 may be disposed in a region overlapping the semiconductor device 151 in the vertical direction, or may be exposed to the outside of the side surface of the semiconductor device 151. The reflective portion 163 may be disposed on a surface of the first metal layer 23 of the first and second frames 121 and 131. The reflective portion 163 may be disposed in a groove of the first metal layer 23 or may be formed on an upper surface of the first metal layer 23.

Here, the first and second frames 121 and 131 may include a resin of reflective material. The resin of the reflective material may be disposed between the semiconductor device 151 and the body 113. The resin of the reflective material may be a material different from that of the molding portion 181. The resin of the reflective material may be in contact with the molding portion 181 and the reflective portion 163. The resin of the reflective material may contact the electrodes P5 and P6 and the first metal layer 23. The resin of the reflective material may prevent the semiconductor device 151 from flowing or tilting. The resin of the reflective material may contact the lower surface of the semiconductor device 151. The resin of the reflective material may be disposed between the bottom surface of the semiconductor device 151 and the frames 121, 131 and the body 113. The resin of the reflective material may be lower than the lower surface of the semiconductor device 151.

The reflective portion 163 may be a resin material, and may include at least one of an epoxy material, a silicone material, a hybrid material including an epoxy material and a silicone material. In addition, the reflective portion 163 may be, for example, a resin including a high refractive index filler such as $Al_2O_3$, $SiO_2$, $TiO_2$, or may include white silicone. The reflective portion 163 may be disposed in the pores of the first metal layer 23 and may be combined. The resin of the reflective material may be formed of the same material as the reflective portion 163.

Figure 16:
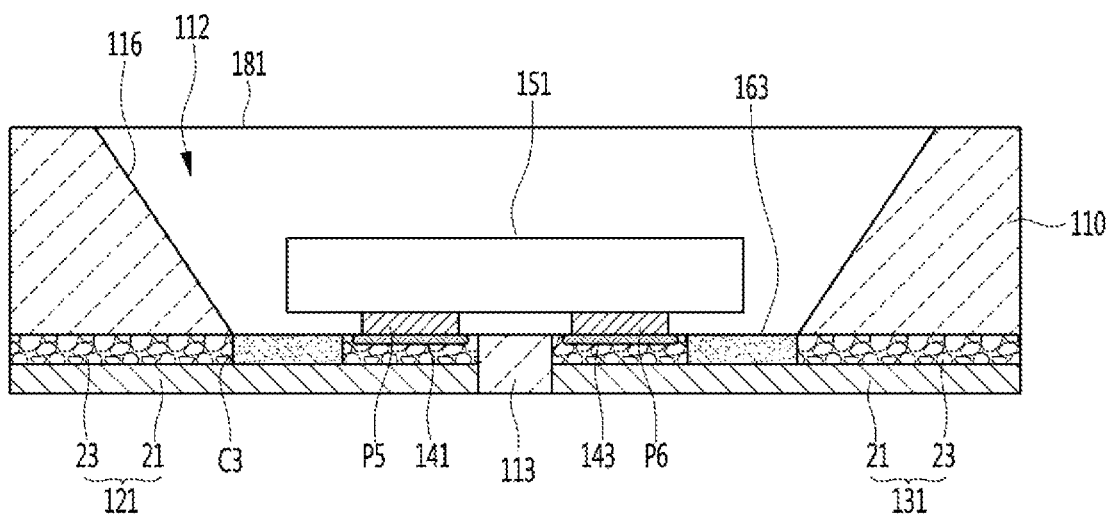
FIG. 16 is a side cross-sectional view of a semiconductor device package according to a second embodiment.

Referring to FIG. 16, the first and second frames 121 and 131 may include a first metal layer 23, and the first metal layer 23 may include an opening C3. The opening C3 may be disposed in at least one or both of the first and second frames 121 and 131. The lower layer 21 may be exposed through the opening C3. The opening C3 may be disposed on the lower layer 21. One or more openings C3 may be disposed in the first and second frames 121 and 131. The openings C3 disposed on the first and second frames 121 and 131 may be connected to each other. The opening C3 may be a region where the first metal layer 23 is removed.

The opening C3 of the first metal layer 23 may overlap the cavity 112 in the vertical direction. The opening C3 may overlap the semiconductor device 151 in the vertical direction. The inner portion of the opening C3 may overlap the semiconductor device 151 in the vertical direction, and the outer portion may not overlap the semiconductor device in the vertical direction. The opening C3 may be disposed in an outer region not overlapping with the electrodes P5 and P6 of the semiconductor device 151 in the vertical direction. The openings C3 of the first metal layer 23 of the first and second frames 121 and 131 may be separated from each other or connected to each other through the body.

A resin reflective portion 163 may be disposed in the opening C3, and the reflective portion 163 may reflect light emitted in a lateral direction of the semiconductor device 151. The reflective parts 163 disposed in the openings C3 of the first and second frames 121 and 131 may be connected to each other. The reflective portion 163 may be disposed on the body 113. The first metal layer 23 and its pores may be in contact with the reflective portion 163 of the resin material.

The reflective portion 163 may be a resin material, and may include at least one of an epoxy material, a silicone material, a hybrid material including an epoxy material and a silicone material. In addition, the reflective portion 163 may be, for example, a resin including a high refractive index filler such as $Al_2O_3$, $SiO_2$, $TiO_2$, or may include white silicone. The reflective portion 163 may be disposed in the pores of the first metal layer 23 and may be combined.

According to the embodiment, the reflective portion 163 may be disposed around the lower portion of the semiconductor device 151 at the bottom of the cavity 112 to improve the light reflection efficiency. The first metal layer 23 is disposed to the electrodes P5 and P6 and a periphery of the electrodes P5 and P6 at the bottom of the cavity 112 to connect the semiconductor devices 151 and the frames 121 and 131 through low temperature bonding by the coupling portions 141 and 143 and may prevent re-melting.

Here, the first and second frames 121 and 131 may include a resin of reflective material. The resin of the reflective material may be disposed between the semiconductor device 151 and the body 113. The resin of the reflective material may be a material different from that of the molding portion 181. The resin of the reflective material may be in contact with the molding portion 181 and the reflective portion 163. The resin of the reflective material may contact the electrodes P5 and P6 and the first metal layer 23. The resin of the reflective material may prevent the semiconductor device 151 from flowing or tilting.

Figure 17:
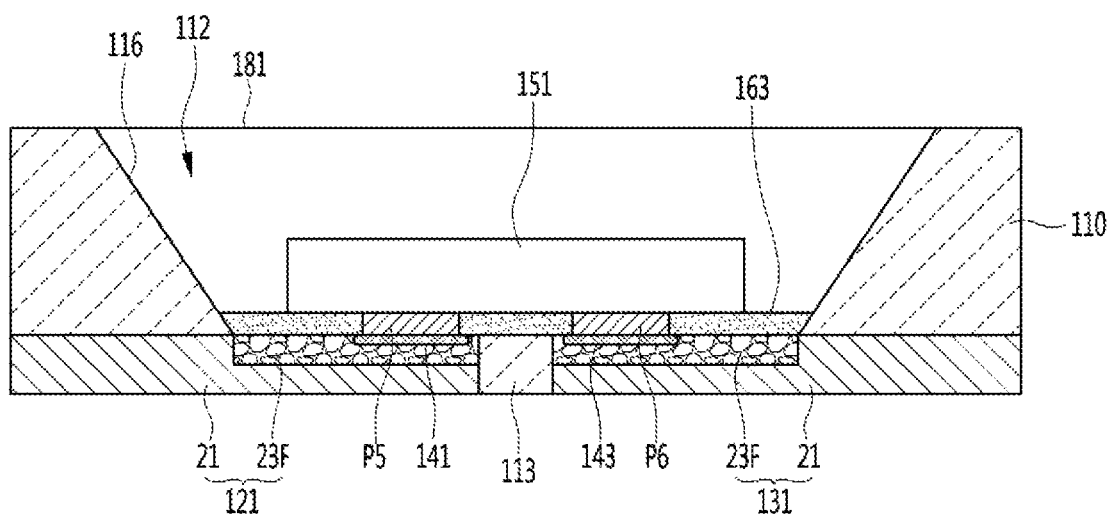
FIG. 17 is a first modified example of the semiconductor device package of FIG. 16.

Referring to FIG. 17, the first metal layer 23F of the frames 121 and 131 is disposed at the bottom of the cavity 112, and the lower layer 21 has a stepped structure and is disposed on the first and second frames 121 and 131. The region of the frame on which the first metal layer 23F is disposed may be provided in a thin thickness, and the region of the frame overlapping the package body 110 may be provided in a thick thickness. The first metal layer 23F may not exist in a region of the frame overlapping the package body 110. The first metal layer 23F may be selectively applied among the structures of FIGS. 1 to 16 disclosed above.

The upper surface of the lower layer 21 in the package body 110 may be disposed on the same plane as the upper surface of the first metal layer 23F. Accordingly, it is possible to increase the adhesive area in the package body 110 and to prevent a decrease in heat dissipation efficiency.

After connecting the electrodes P5 and P6 of the semiconductor device 151 and the frames 121 and 131 through the coupling portions 141 and 143 on the first metal layer 23F, the resin reflective portion 163 may be disposed on the bottom of the cavity 112. The reflective portion 163 may be disposed on the entire bottom of the cavity 112 and may contact the bottom surface of the semiconductor device 151. The reflective portion 163 may be disposed in the pores of the first metal layer 23F and may be in contact with a portion of the side surface of the semiconductor device 151. The reflective portion 163 may improve light reflection efficiency at the bottom of the cavity 112 and reduce light loss caused by the first metal layer 23F.

The reflective portion 163 may be disposed on the first and second frames 121 and 131. The reflective portion 163 may be disposed between the semiconductor device 151 and the body 113. The reflective portion 163 may face a region between the first and second electrodes P5 and P6 of the semiconductor device 151 and a perimeter of a lower surface of the semiconductor device 151. The reflective portion 163 may be applied to at least one of FIGS. 1 to 16.

The reflective portion 163 may be made of a material different from that of the molding portion 181. The reflective portion 163 may be in contact with the molding portion 181. The reflective portion 163 may be in contact with the coupling portions 141 and 143. The reflective portion 163 may be in contact with the electrodes P5 and P6 and the first metal layer 23. The reflective portion 163 may be in contact with the side surface 116 of the cavity 112. The reflective portion 163 may reflect or diffuse the lower portion of the semiconductor device 151, and may reflect light emitted in a lateral direction of the semiconductor device 151. The reflective portion 163 attaches the semiconductor device 151 to the body 113, thereby preventing the semiconductor device 151 from flowing or tilting due to the reflow process.

Figure 18:
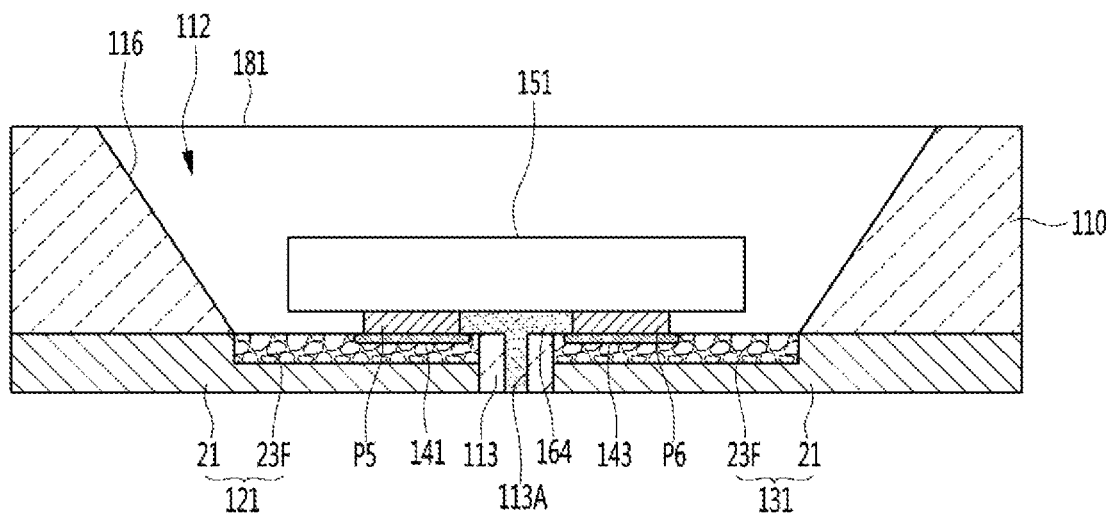
FIG. 18 is an eighth modified example of the semiconductor device package of FIG. 2.

FIG. 18 is another example of the semiconductor device package of FIG. 2, and the configuration of the above-described embodiments or modified examples may be selectively applied.

Referring to FIG. 18, in the semiconductor device package, the body 113 may be formed of the same material as or different from that of the package body 110. The package body 110 may include a cavity 112. The body 113 may include a through hole 113A penetrating in the vertical direction. The through hole 113A may penetrate in a direction of a lower surface from an upper surface of the body 113. The through hole 113A may be disposed in the body 113 and may overlap with the semiconductor device 151 in the vertical direction. The through hole 113A may be disposed between the first and second frames 121 and 131. The through hole 113A may be disposed between the first metal layers 23F of the first and second frames 121 and 131. The through hole 113A may be disposed to have the same depth as the thickness of the first and second frames 121 and 131.

The first metal layer 23F of the first and second frames 121 and 131 may be selectively applied among the structures of FIGS. 1 to 16 described above.

A width in the first direction of the through hole 113A may be smaller than a gap between the first and second frames 121 and 131. The first width of the through hole 113A may be smaller than a gap between the first metal layers 23F on the first and second frames 121 and 131. The width of the through hole 113A in the first direction (X direction in FIG. 1) may be smaller than the width of the body 113, and may be, for example, in a range of ½ to ⅕. When the first direction width of the through hole 113A is smaller than the range, the rigidity of the body 113 may be lowered, and when larger than the range, the heat dissipation effect may be insignificant.

The length of the second hole (Y direction of FIG. 1) of the through hole 113A may be equal to or smaller than the length of the second direction of the semiconductor device 151. The second direction may be Y direction in FIG. 1. A region in which the through hole 113A of the body 113 is disposed may be overlapped in the vertical direction between the electrodes P5 and P6 of the semiconductor device 151.

An adhesive 164 may be disposed between the semiconductor device 151 and the body 113. The adhesive 164 may be adhered between the semiconductor device 151 and the body 113. A portion of the adhesive 164 may be in contact with the electrodes P5 and P6. The adhesive 164 may be disposed in the through hole 113A of the body 113 to be exposed to the bottom of the package body 110 or the bottom of the body 113. The adhesive 164 may be a reflective resin member or a heat dissipating resin member. The adhesive 164 may include a reflective resin. The adhesive 164 is dispensed onto the body 113 and then bonds the semiconductor device 161. In this case, the adhesive 164 may prevent flow or tilt of the semiconductor device 161 after curing. The adhesive 164 may be injected from the upper portion of the body 113 to the lower direction, or may be injected from the lower portion of the body to the upper direction.

The adhesive 164 may include, for example, at least one of an epoxy-based material, a silicone-based material, a hybrid material including an epoxy-based material and a silicone-based material. In addition, the adhesive 164 may be a filler such as $Al_2O_3$, $SiO_2$, or $TiO_2$ in a silicone material, or may include a thermally conductive filler. The adhesive 164 may include white silicone. The adhesive 164 may be in contact with the semiconductor device 151 to be used as a heat dissipation path. In addition, the adhesive 164 may be used as a member for supporting the semiconductor device 151.

In addition, the adhesive 164 may be disposed around the bottom of the semiconductor device 151 and may contact the bottom and side surfaces of the semiconductor device 151.

The through hole 113A may provide an appropriate space in which a kind of underfill process may be performed under the semiconductor device 151. The underfill process may be a process of mounting the semiconductor device 151 on the package body 110 and then disposing the adhesive 164 under the semiconductor device 151. In the process of mounting the semiconductor device 151 on the package body 110, the underfill process may be a process of disposing the semiconductor device 151 after placing the adhesive 164 in the through hole 113A to mount through the adhesive 164.

Figure 19:
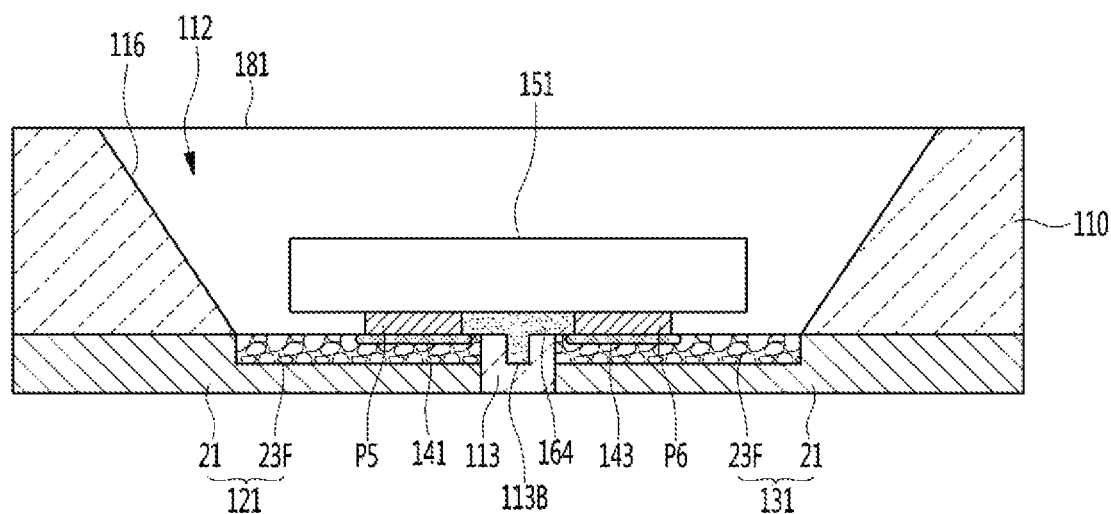
FIG. 19 is a ninth modified example of the semiconductor device package of FIG. 2.

FIG. 19 is a third embodiment of a semiconductor device package according to an embodiment, and the above-described configuration may be selectively applied to the present embodiment.

Referring to FIG. 19, the body 113 may have a recess 113B. The recess 113B may be disposed in a region overlapping the semiconductor device 151 in the vertical direction. The recess 113B may be disposed between the first metal layers 23F of the first and second frames 121 and 131.

One or more recesses 113B may be disposed on the body 113 disposed between the first and second frames 121 and 131. The plurality of recesses 113B may be disposed in a region overlapping the semiconductor device 151 in the vertical direction. The upper shape of the recess 113B may include a circular shape, an elliptic shape, or a polygonal shape. When the lengths of the first and second directions of the recess 113B are different from each other, the length of the second direction may be longer than the length of the first direction.

An adhesive 164 may be disposed between the semiconductor device 151 and the body 113. The adhesive 164 may be adhered between the semiconductor device 151 and the body 113. A portion of the adhesive 164 may be in contact with the electrodes P5 and P6. The adhesive 164 may be disposed in the recess 113B of the body 113. The adhesive 164 may be a reflective resin member or a heat dissipating resin member.

The recess 113B may be formed to have a predetermined depth smaller than the thickness of the body 113 from an upper surface of the body 113. The depth of the upper recess 113B may be determined in consideration of the adhesive force of the adhesive 164 disposed between the body 113 and the semiconductor device 151. The depth of the recess 113B may be 50% or less of the thickness of the first and second frames 121 and 131 or 5% to 50% or less of the thickness of the first and second frames 121 and 131. The recess 113B may serve as a dam of the adhesive 164 introduced by the depth.

The depth of the recess 113B may be considered in consideration of the stable strength of the body 113 and/or may be determined to prevent cracks in the semiconductor device package 100 due to heat emitted from the semiconductor device 151. The recess 113B may provide an appropriate space under the semiconductor device 151 in which a kind of underfill process may be performed. Here, the underfill process may be a process of mounting the semiconductor device 151 on the package body 110 and then disposing the adhesive 164 under the semiconductor device 151. In the process of mounting the 151 on the package body 110, the underfill process may be a process of disposing the semiconductor device 151 after disposing the adhesive 164 in the recess 113B to mount the adhesive 164 through the adhesive 164.

The adhesive 164 may include, for example, at least one of an epoxy-based material, a silicone-based material, a hybrid material including an epoxy-based material and a silicone-based material. Also as an example, when the adhesive 164 includes a reflective function, the adhesive may include white silicone. The light diffusing function and the heat radiating function may be performed. The adhesive 164 may be a filler in a silicone material, for example, a ceramic material such as $Al_2O_3$, $SiO_2$, $TiO_2$, or may include a thermally conductive filler.

In addition, the adhesive 164 may be disposed around the bottom of the semiconductor device 151 and may contact the bottom and side surfaces of the semiconductor device 151.

Figure 20:
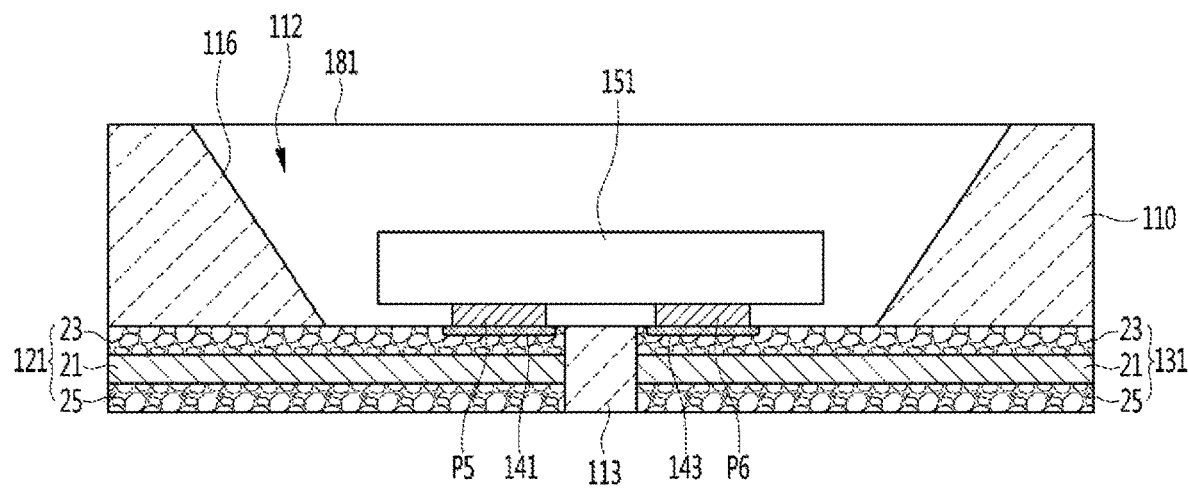
FIG. 20 is a side cross-sectional view of a device package according to a third embodiment.

Referring to FIG. 20, the frames 121 and 131 may include a first metal layer 23 having a plurality of pores on the lower layer 21 and a third metal layer 25 having a plurality of pores on the lower layer 21. The second and third metal layers 23 and 25 may refer to the configuration and description of the above embodiments, and the modifications described above may be selectively applied. For example, the second and third metal layers 23 and 25 may have an opening, a concave groove, or a structure divided into a plurality of divided regions.

The third metal layer 25 may improve the wetting of the solder when bonding with the circuit board, thereby increasing the adhesive area of the adhesive between the frames 121 and 131 of the semiconductor device package 100 and the circuit board.

Figure 21:
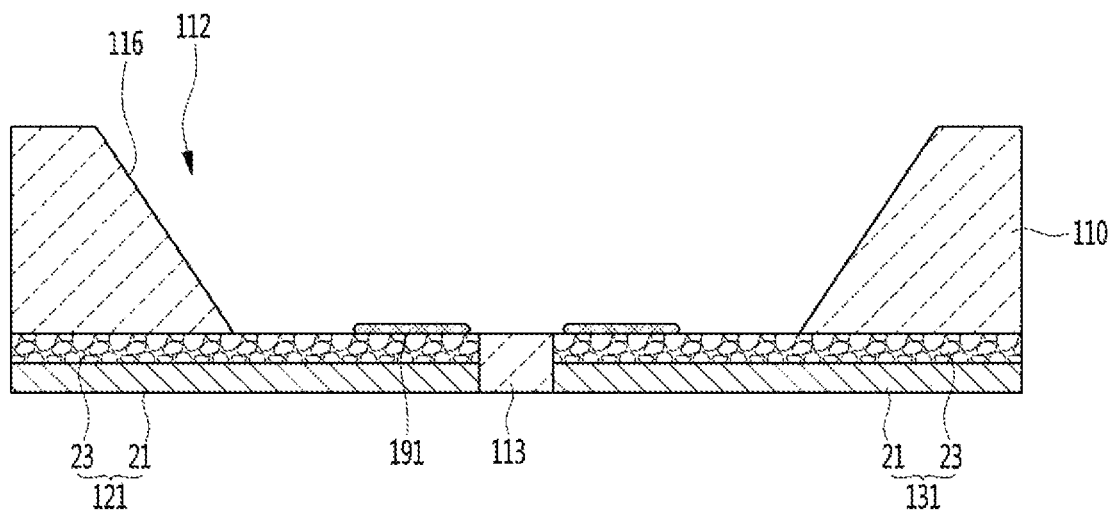
FIGS. 21 to 24 are views illustrating a manufacturing process of a device package according to an embodiment.
Figure 22:
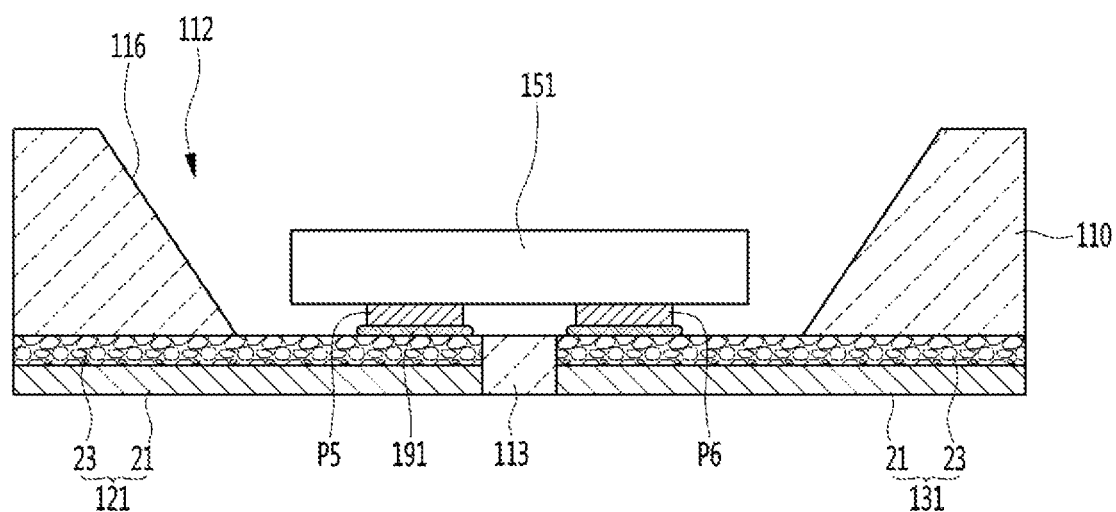
Figure 23:
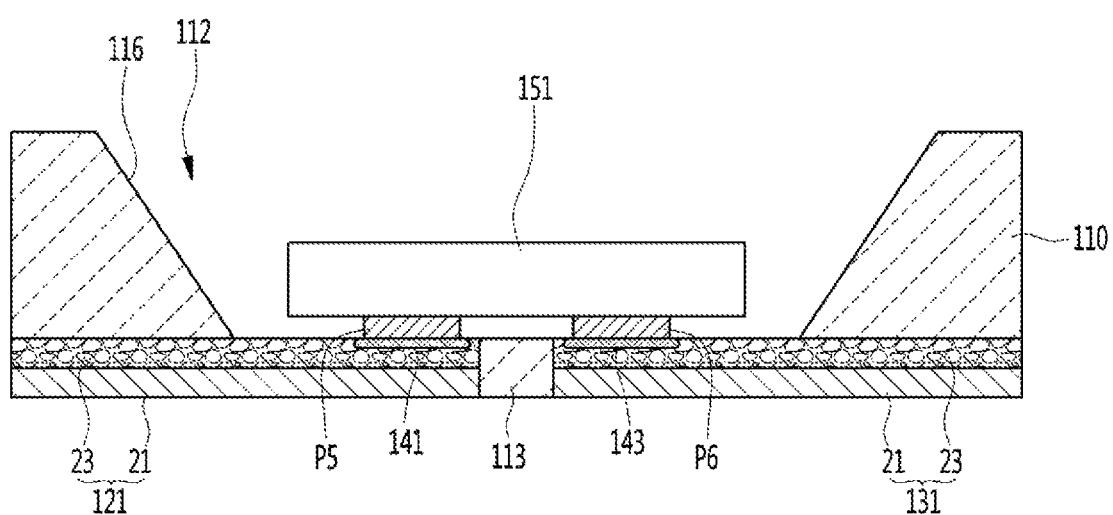

FIGS. 21 to 23 illustrate a method of manufacturing a semiconductor device package according to an embodiment. In describing the method of manufacturing the semiconductor device package, the same configuration as that described above may be omitted and may be optionally included.

As shown in FIG. 21, when the frames 121 and 131 having the lower layer 21 and the first metal layer 23 are coupled to the package body 110 of the semiconductor device package, the semiconductor device 151 is placed on the bottom of the cavity 112. The adhesive 191 is disposed in the area to be mounted. The adhesive 191 may be a flux material. As shown in FIG. 22, the semiconductor device 151 is pre-bonded to the adhesive 191, and then the position is fixed. In this case, the adhesive 191 may be removed, and in this case, the electrodes P5 and P6 of the semiconductor device 151 may be bonded to the first metal layer 23 to be fixed by pre-bonding.

As shown in FIG. 23, the coupling portions 141 and 143 are formed by bonding the electrodes P5 and P6 of the semiconductor device 151 and the first metal layer 23 through a reflow process. The coupling portions 141 and 143 may be referred to the above description, and the temperature during the reflow process is 250 degrees or less. In this case, when the coupling portions 141 and 143 are formed, some of the pores of the first metal layer 23 may be deformed, or the coupling portions 141 and 143 may be filled in the pores.

Figure 24:
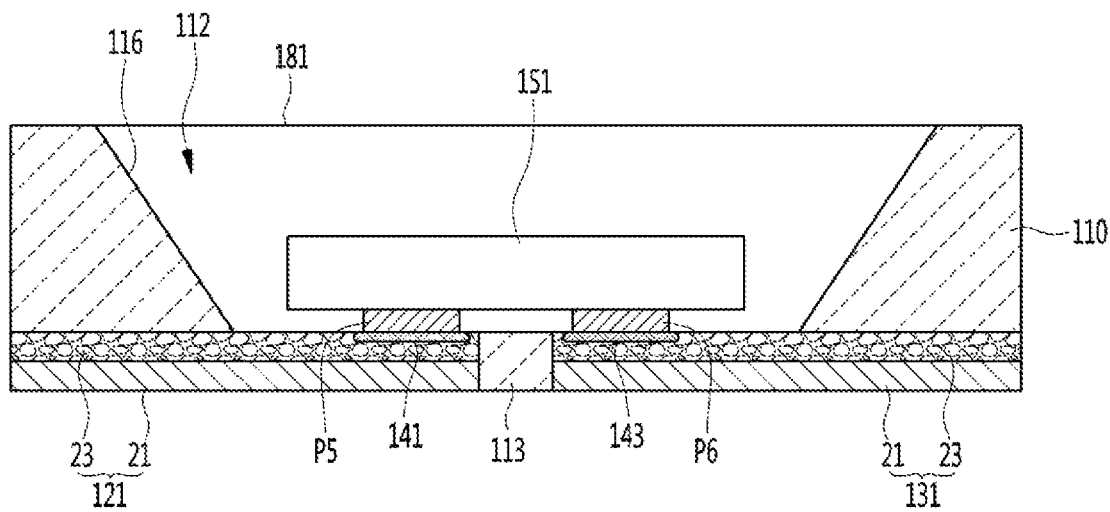

As shown in FIG. 24, when the semiconductor device 151 is bonded to the frames 121 and 131, the molding device 181 may be filled to cover the semiconductor device 151. Detailed configuration of the molding portion 181 may be referred to the disclosed description. When the semiconductor device package is completed, a bonding process of arranging and reheating the circuit board is performed. At this time, the coupling portions 141 and 143 bonded at low temperatures are not dissolved, thereby providing reliability to the semiconductor device.

Figure 25:
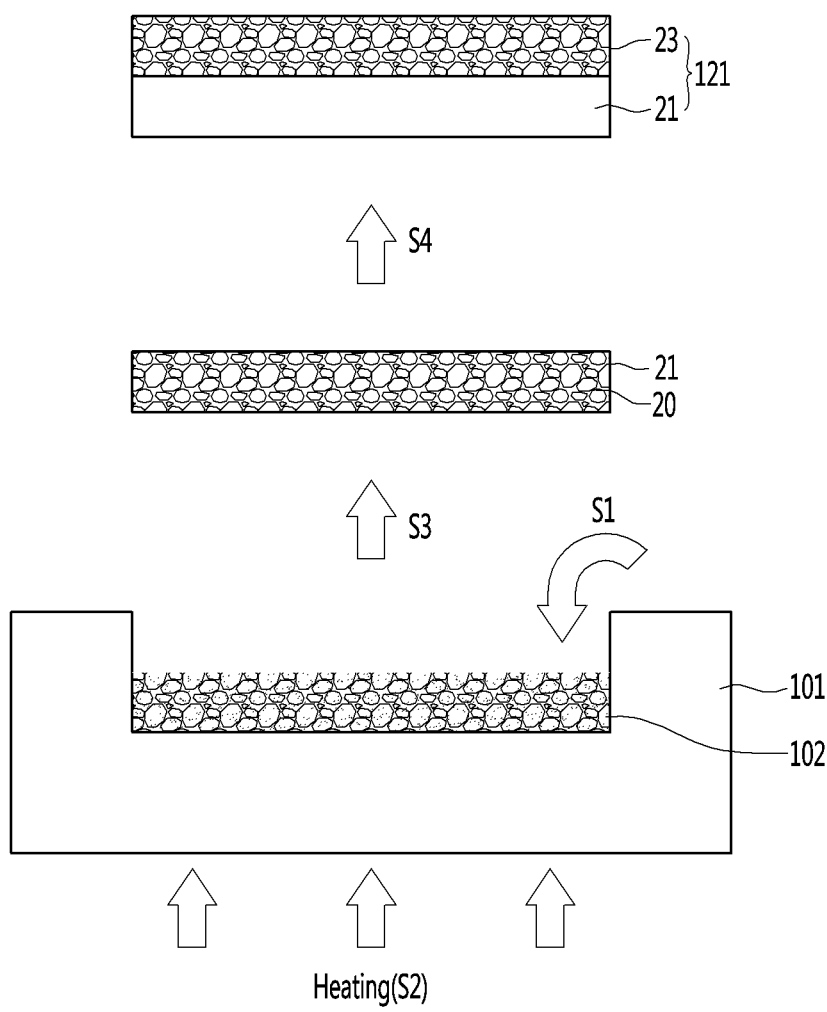
FIG. 25 is a view illustrating a manufacturing process of the porous metal layer of the frame according to the embodiment.

FIG. 25 is a view illustrating an example of a manufacturing process of a frame according to an embodiment, in which a mixture 102 of a metal nanoparticle and a polymer is contained in an accommodating container 101 (S1). At this time, the metal nanoparticles may be a material such as Cu, Au, Ag, Al, the polymer is polyurethane, polystyrene, polypropylene, polyethylene, polyoxymethylene or other suitable polymer, or Polymerized polyurethane may be provided that polymerize polyisocyanate and polyols.

Then, when the mixture 102 is heated or cured (S2), the polymer in the mixture is removed, where a metal layer having pores 20 (i.e., the first metal layer) may be formed in the region where the polymer is removed (S3). The frame 121 may be completed by adhering the first metal layer 23 onto the lower layer 21 prepared in advance.

The formation of the first metal layer 23 may be modified according to the shape of the mixture or the shape of the mold. For example, the first metal layer 23 may have a flat plate shape, a curved plate shape, or a bent plate shape.

Figure 26:
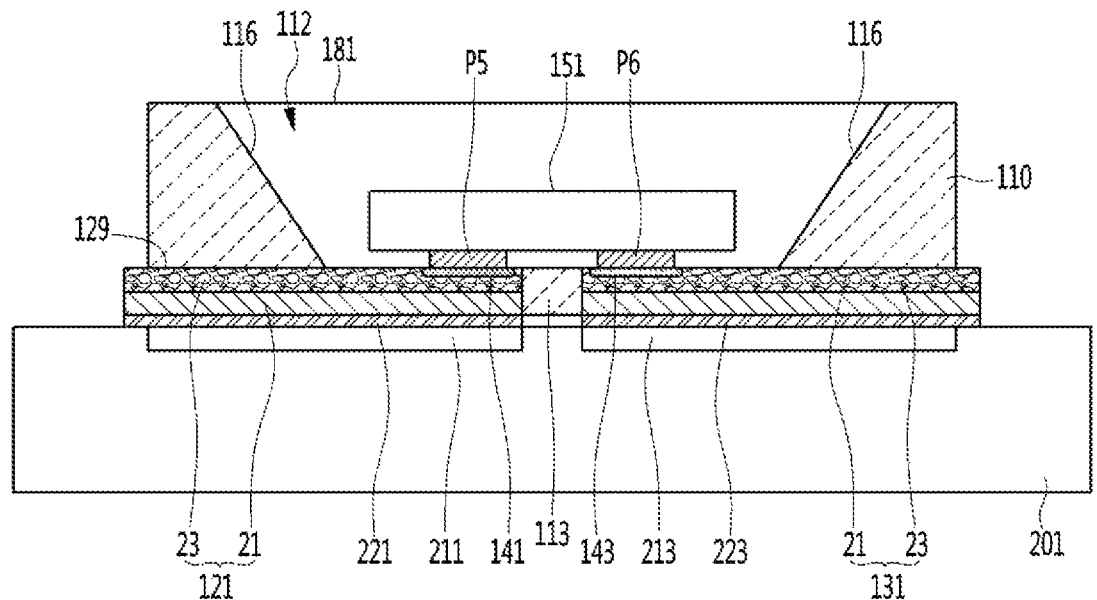
FIG. 26 is a side cross-sectional view of the module with the device package of FIG. 2.

FIG. 26 is an example of a module or light source device having a semiconductor device package according to an embodiment.

Referring to FIG. 26, the semiconductor device package 100 is disposed on the circuit board 201. The circuit board 201 may be arranged in a light unit such as a display device, a terminal, a vehicle lamp, and a lighting device. The circuit board 201 may include a circuit layer electrically connected to the semiconductor device package 100. The circuit board 201 may include at least one of a resin PCB, a metal core PCB (MCPCB), a non-flexible PCB, and a flexible PCB (FPCB), but is not limited thereto.

Third and fourth electrode pads 211 and 213 are disposed on the circuit board 201, and the third electrode pad 211 is formed of the first frame 121 and the conductive adhesive 221 of the semiconductor device package 100. The fourth electrode pad 223 may be bonded to the second frame 131 of the semiconductor device package 100 with the conductive adhesive 223. The conductive adhesives 221 and 223 may include, for example, solder paste.

Figure 27:
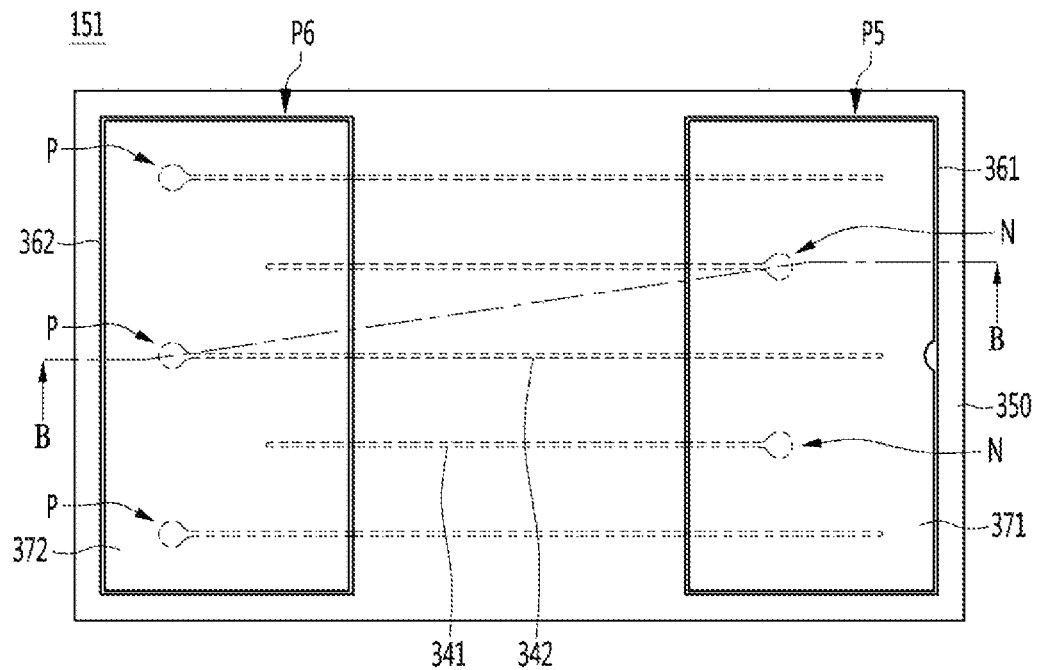
FIG. 27 is a device example of a device package according to an embodiment, which is a plan view of a light emitting device.
Figure 28:
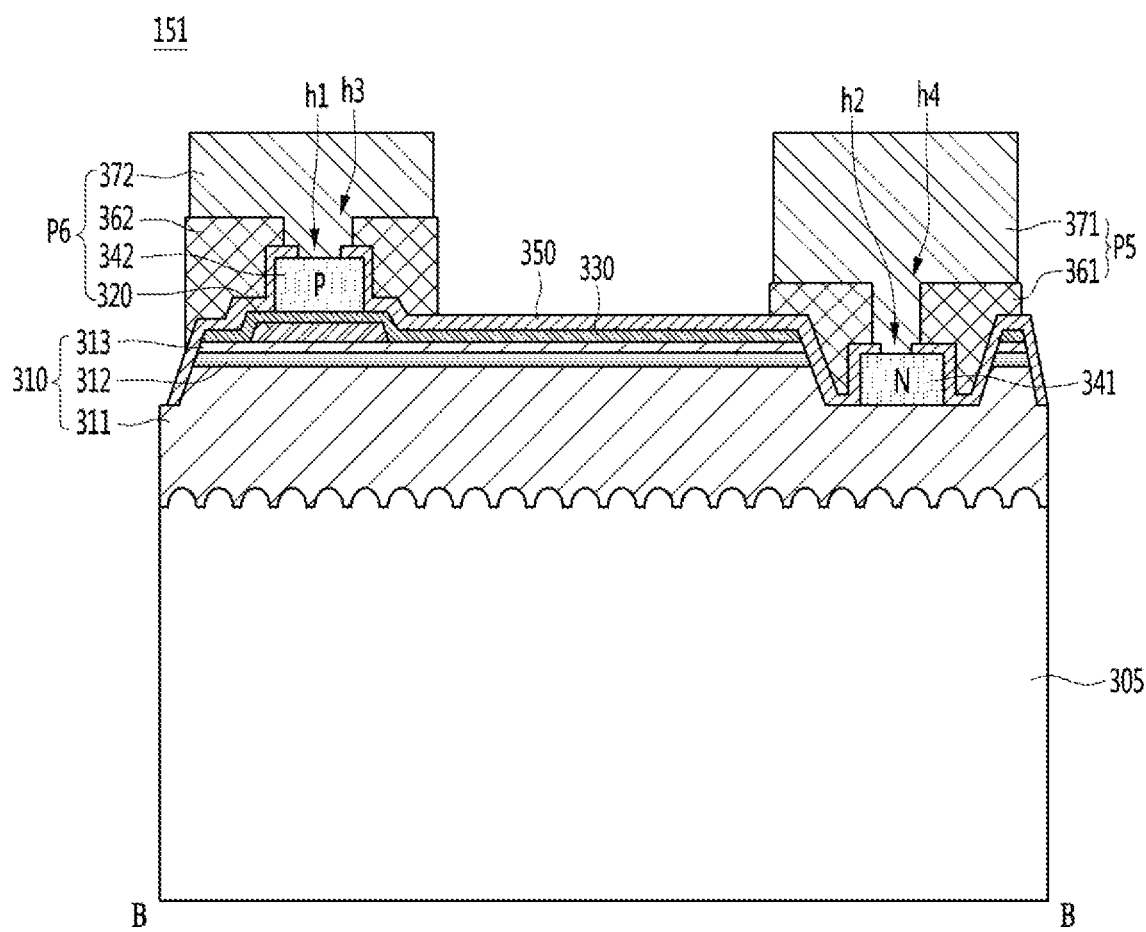
FIG. 28 is a cross-sectional view taken along the B-B side of the light emitting device of FIG. 27.

FIG. 27 is a plan view illustrating a light emitting device of the semiconductor device package according to the embodiment, and FIG. 28 is a side cross-sectional view taken along line B-B of the device package of FIG. 27. The semiconductor device described below will be described as an example of a light emitting device.

Referring to FIG. 27, in the semiconductor device 151, the first pad 371 of the first electrode P5 and the second pad 372 of the second electrode P6 are spaced apart from each other in one direction. One or a plurality of first electrode portions 341 connected to the first electrode P5 may extend in the first direction and overlap with the second electrode P6 in the vertical direction. One or a plurality of second electrode portions 342 connected to the second electrode P6 may extend in the first direction and overlap the first electrode P5 in the vertical direction. The first direction may be a length direction of the semiconductor device, and may be a direction orthogonal to the second direction. The first and second electrodes P5 and P6 may be disposed to have a long length in a second direction. In FIGS. 27 and 28, the P region and the N region may be regions showing via structures connected to different semiconductor layers. The electrode portions 341 and 342 may diffuse a current to the entire area.

The semiconductor device 151 may include a substrate 305 and a light emitting structure 310 disposed thereon. The substrate 305 may be removed. The substrate 305 may be selected from a group including sapphire substrate ($Al_2O_3$), SiC, GaAs, GaN, ZnO, Si, GaP, InP, or Ge. For example, an irregular pattern may be formed on an upper surface of the substrate 305.

The light emitting structure 310 may include a first conductive semiconductor layer 311, an active layer 312, and a second conductive semiconductor layer 313. The active layer 312 may be disposed between the first conductive semiconductor layer 311 and the second conductive semiconductor layer 313. For example, the active layer 312 may be disposed on the first conductive semiconductor layer 311, and the second conductive semiconductor layer 313 may be disposed on the active layer 312.

In example embodiments, the first conductive semiconductor layer 311 may be provided as an n-type semiconductor layer, and the second conductive semiconductor layer 313 may be provided as a p-type semiconductor layer. Of course, according to another embodiment, the first conductive semiconductor layer 311 may be provided as a p-type semiconductor layer, and the second conductive semiconductor layer 313 may be provided as an n-type semiconductor layer. Hereinafter, for convenience of description, the first conductive semiconductor layer 311 is provided as an n-type semiconductor layer, and the second conductive semiconductor layer 313 will be described based on the case where the p-type semiconductor layer is provided.

The light emitting structure 310 may be provided as a compound semiconductor. The light emitting structure 310 may be provided as, for example, a Group III-V or Group II-VII compound semiconductors. For example, the light emitting structure 310 may include at least two elements selected from aluminum (Al), gallium (Ga), indium (In), phosphorus (P), arsenic (As), and nitrogen (N).

The first and second conductive semiconductor layers 311 and 313 may be provided as, for example, a Group III-V or Group II-VII compound semiconductors. For example, the first and second conductive semiconductor layers 311 and 313 may be semiconductor materials having a composition formula of $In_xAl_yGa_{1-x-y}N$ ($0 \leq x \leq 1$, $0 \leq y \leq 1$, $0 \leq x+y \leq 1$), or a semiconductor material having a compositional formula of $(Al_xGa_{1-x})_yIn_{1-y}P$ ($0 \leq x \leq 1$, $0 \leq y \leq 1$). For example, the first and second conductive semiconductor layers 311 and 313 may be selected from GaN, AlN, AlGaN, InGaN, InN, InAlGaN, AlInN, AlGaAs, GaP, GaAs, GaAsP, AlGaInP, AlInP, GaInP, and the like. The first conductive semiconductor layer 311 may be doped with an n-type dopant selected from the group consisting of Si, Ge, Sn, Se, Te, and the like. The second conductive semiconductor layer 313 may be doped with a p-type dopant selected from the group consisting of Mg, Zn, Ca, Sr, and Ba.

The active layer 312 may be provided as, for example, a Group 2-6 compound semiconductor or a Group 3-5 compound semiconductor. For example, the active layer 312 may be formed of a semiconductor material having a composition formula of $In_xAl_yGa_{1-x-y}N$ ($0 \leq x \leq 1$, $0 \leq y \leq 1$, $0 \leq x+y \leq 1$) or a semiconductor material having a composition formula of $(Al_xGa_{1-x})_yIn_{1-y}P$ ($0 \leq x \leq 1$, $0 \leq y \leq 1$). For example, the active layer 312 may be selected from the group including GaN, AlGaN, InGaN, InN, InAlGaN, AlInN, AlGaAs, GaP, GaAs, GaAsP, AlGaInP, AlInP, GaInP, and the like. For example, the active layer 312 may be provided in a multi-well structure, and may include a plurality of barrier layers and a plurality of well layers.

The current spreading layer 320 and the ohmic contact layer 330 may be disposed on the light emitting structure 310. The current spreading layer 320 and the ohmic contact layer 330 may increase light output by improving current spreading. The current spreading layer 320 may be formed of, for example, an oxide or a nitride. The horizontal width of the current spreading layer 320 may be provided to be equal to or greater than the horizontal width of the second electrode P6 disposed thereon. Accordingly, the current spreading layer 320 may improve luminous flux by preventing current concentration under the second electrode P6 to improve electrical reliability.

In addition, the ohmic contact layer 330 may include at least one selected from the group consisting of metals, metal oxides, and metal nitrides. The ohmic contact layer 330 may include a light transmissive material. For example, the ohmic contact layer 330 may be formed of indium tin oxide (ITO), indium zinc oxide (IZO), IZON (IZO nitride), indium zinc tin oxide (IZTO), indium aluminum zinc oxide (IZAZO), and indium gallium (IGZO). zinc oxide), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, Pd may include at least one selected from the group, and may be formed in a single layer or multiple layers.

The first electrode P5 may include a first electrode portion 341 electrically connected to the first conductive semiconductor layer 311, and the first electrode portion 341 may be the first conductive semiconductor. May be disposed over layer 311. The first electrode portion 341 may be disposed on an upper surface of the first conductive semiconductor layer 311 exposed by removing a portion of the second conductive semiconductor layer 313 and a portion of the active layer 312.

The second electrode P6 may have a second electrode portion 342 electrically connected to the second conductive semiconductor layer 313. According to an embodiment, the second electrode portion 342 and the first electrode may be disposed. The current spreading layer 320 may be disposed between the two conductive semiconductor layers 313.

The first and second electrode portions 341 and 342 may be formed in a single layer or a multilayer structure. For example, the first and second electrode portions 341 and 342 may be ohmic electrodes. For example, the first and second electrode portions 341 and 342 may include at least one of ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, Hf or two or more of these materials.

The protective layer 350 may be disposed on the first and second electrode portions 341 and 342. The protective layer 350 may have openings h1 and h2 to expose the first and second electrode portions 341 and 342. For example, the protective layer 350 may be provided as an insulating material. For example, the protective layer 350 may be formed of at least one material selected from the group consisting of $SiO_2$, $SiO_x$, $SiO_xN_y$, $Si_3N_4$, and $Al_2O_3$.

The insulating reflective layers 361 and 362 may be disposed on the protective layer 350. The insulating reflective layers 361 and 361 may be portion of the first and second electrodes P5 and P6. The insulating reflective layers 361 and 362 may have openings h3 and h4, and may expose the first electrode portion 341 and the second electrode portion 342. For example, the insulating reflective layers 361 and 362 may be distributed Braggs and be provided as a reflector layer or an Omni-directional reflector (ODR) layer, for example, provided as $TiO_2$ and $SiO_2$ or $Ta_2O_5$ and $SiO_2$. The insulating semiconductor layers 361 and 362 may be formed around the electrode to reflect light emitted from the active layer 312 of the light emitting structure 310, thereby minimizing light absorption and improving brightness.

The first pad 361 may be connected to the first electrode portion 341 through the opening h4, and the second pad 362 may be connected to the second electrode portion 342 through the opening h3. The first and second pads 361 and 362 may be formed in a single layer or multiple layers using one or more materials or alloys of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO.

The semiconductor device according to the embodiment may be connected to an external power source through a flip chip bonding method through the first and second pads 361 and 362. For example, the first pad 361 and the second pad 362 have Ti, Cr, Ni, Sn, In, Pd, Cu, Au, Ag, and are formed in a single layer or multiple layers, so that a bonding process may be proceed stable.

When the semiconductor device according to the embodiment is mounted in a flip chip bonding method and implemented as a package, light provided from the light emitting structure 310 may be emitted through the substrate 305. In addition, according to the semiconductor device according to the embodiment, since the first pad 361 and the second pad 363 having a large area may be directly bonded to a circuit board that provides power, the flip chip bonding process may proceed to easy and stable.

The metal layer or frame having pores according to the embodiment may be applied to the above embodiments or modifications, and the configuration of the above-described embodiments or modifications may be selectively applied to other modifications or embodiments.

The semiconductor device package or the light emitting unit according to the embodiment may be applied to the light source device. The light source device may be applied to a display device, a lighting device, a vehicle lamp, for example, a lamp such as a fog light, a traffic light, a turn signal, a brake light, a tail light, a reverse light, a high beam, a downlight, and a fog light.

The light source device may include at least one of an optical lens or an optical sheet having a light guide plate in the light emitting region. As an example of the light source device, the display device may include a bottom cover, a reflective portion disposed on the bottom cover, a light emitting module emitting light and including a light emitting device, and a light disposed in front of the reflective portion and guiding light emitted from the light emitting module to the front. The display device may include an optical sheet including a light guide plate, prism sheets disposed in front of the light guide plate, a display panel disposed in front of the optical sheet, an image signal output circuit connected to the display panel and supplying an image signal to the display panel, a color filter disposed in front of the display panel. The bottom cover, the reflective portion, the light emitting module, the light guide plate, and the optical sheet may form a backlight unit. In addition, the display device does not include a color filter, and may have a structure in which light emitting devices emitting red, green, and blue light are disposed.

As another example of the light source device, the head lamp includes a light emitting module including a light emitting device package disposed on a substrate, a reflective portion reflecting light emitted from the light emitting module in a predetermined direction, for example, a front reflector. It may include a lens for refracting the light forward, and a shade for blocking or reflecting a portion of the light reflected by the reflective portion toward the lens to achieve a light distribution pattern desired by the designer.

Another example of a light source device may be a lighting device including a cover, a light source module, a heat sink, a power supply, an inner case, and a socket. In addition, the light source device according to the embodiment may further include any one or more of the member and the holder. The light source module may include a light emitting device package according to the embodiment.

Features, structures, effects, etc. described in the above embodiments are included in at least one embodiment, but are not necessarily limited to one embodiment. Furthermore, the features, structures, effects, and the like illustrated in the embodiments may be combined or modified with respect to other embodiments by those skilled in the art to which the embodiments belong. Therefore, it should be interpreted that the contents related to such a combination and modification are included in the scope of the embodiments.

Although the above description has been made with reference to the embodiments, these are only examples and are not intended to limit the embodiments, and those of ordinary skill in the art to which the embodiments pertain may have several examples that are not exemplified above without departing from the essential characteristics of the embodiments. It will be appreciated that eggplant modifications and applications are possible. For example, each component specifically shown in the embodiment may be modified. And differences related to such modifications and applications will have to be construed as being included in the scope of the embodiments set out in the appended claims.

What is claimed is:

1. A semiconductor device package comprising:
first and second frames spaced apart from each other;
a body disposed between the first and second frames; and
a semiconductor device disposed on the first and second frames and including a semiconductor layer and first and second electrodes on the semiconductor layer,
wherein the first and second frames include a first metal layer having a plurality of pores,
wherein the first metal layer of the first frame includes a first coupling portion in a first recessed region overlapping the first electrode,
wherein the first metal layer of the second frame includes a second coupling portion in a second recessed region overlapping the second electrode,
wherein the body contacts an inner surface of the first frame and an inner surface of the second frame, and
wherein an upper surface area of the first coupling portion has a larger area than a lower surface area of the first electrode, and an upper surface area of the second coupling portion has a larger area than a lower surface area of the second electrode.

2. The semiconductor device package of claim 1,
wherein the first metal layer includes at least one of Cu, Au, Ag, and Al, and
wherein the first electrode and the second electrode comprise at least one of Ti, Cr, Ni, Sn, In, Pd, Cu, Au and Ag.

3. The semiconductor device package of claim 2,
wherein the first and second coupling portions include at least one of $Ag_xIn_y$, $Cu_xSn_y$, $Ag_xSn_y$, $Au_xSn_y$, $Cu_xNi_y$, and $Al_xSn_y$, wherein the x is $0<x<1$ and $y=1-x$.

4. The semiconductor device package of claim 3,
wherein the first metal layer is disposed in a region overlapping with the semiconductor device in a vertical direction, and
wherein the body contacts the first metal layer of the first and second frames.

5. The semiconductor device package of claim 3,
wherein the first metal layer is disposed on a partial region or an entire region of the first and second frames.

6. The semiconductor device package of claim 5, further comprising:
a package body on the first and second frames,
wherein the package body includes a cavity, which is open at an upper portion and the first and second frames are exposed,
wherein the first metal layer of the first and second frames is exposed at a bottom of the cavity, and
wherein the first and second electrodes of the semiconductor device face the first metal layer of the first and second frames.

7. The semiconductor device package of claim 6,
wherein the first metal layer is disposed in a region overlapping the package body, and a portion of the package body is disposed in the pores of the first metal layer.

8. The semiconductor device package of claim 1, further comprising:
a reflective portion of a resin material between the body and the semiconductor device,
wherein the reflective portion contacts the semiconductor device and the body,
wherein the reflective portion is disposed on the first metal layer of the first and second frames, and
wherein the semiconductor device package comprises a light emitting device.

9. The semiconductor device package of claim 1,
wherein the body includes a recess or through hole recessed in a direction of a lower surface from an upper surface of the body, and
wherein an adhesive is disposed in the recess or through hole between the body and the semiconductor device.

10. A semiconductor device package comprising:
a first frame and a second frame spaced apart from each other;
a body disposed between the first and second frames; and
a semiconductor device configured to emit light disposed on the first and second frames and including a semiconductor layer and first and second electrodes on the semiconductor layer,
wherein the first frame includes a first metal layer having a plurality of pores thereon,
wherein the second frame includes a second metal layer having a plurality of pores thereon,
wherein the first electrode faces the first metal layer in a vertical direction,
wherein the second electrode faces the second metal layer in the vertical direction,
wherein the first metal layer includes a first coupling portion coupled to a lower end of the first electrode,
wherein the second metal layer includes a second coupling portion coupled to a lower end of the second electrode,
wherein the first frame is electrically connected to the first electrode,
wherein the second frame is electrically connected to the second electrode,
wherein the body insulates between the first and second metal layers,
wherein an upper surface area of the first coupling portion has a larger area than a lower surface area of the first electrode, and an upper surface area of the second coupling portion has a larger area than a lower surface area of the second electrode.

11. The semiconductor device package of claim 10,
wherein each of the first and second frames includes a base layer and an adhesive layer on a surface of the base layer, and
wherein the base layer and the adhesive layer is formed of a different metal.

12. The semiconductor device package of claim 11,
wherein the first metal layer is bonded to the first electrode in the first coupling portion, and
wherein the second metal layer is bonded to the second electrode in the second coupling portion.

13. The semiconductor device package of claim 11,
wherein an area of an upper surface of the first metal layer is larger than the area of the lower surface of the first electrode, and
wherein an area of an upper surface of the second metal layer is larger than the area of the lower surface of the second electrode.

14. The semiconductor device package of claim 13,
wherein the area of the upper surface of the first metal layer is equal to or smaller than an area of a lower surface of the first frame, and
wherein the area of the upper surface of the second metal layer is the same as or smaller than an area of a lower surface of the second frame.

15. The semiconductor device package of claim 11,
wherein the first metal layer includes at least one of Cu, Au, Ag, and Al,
wherein the first electrode and the second electrode include at least one of Ti, Cr, Ni, Sn, In, Pd, Cu, Au and Ag, and
wherein the first and second coupling portions include at least one of $Ag_xIn_y$, $Cu_xSn_y$, $Ag_xSn_y$, $Au_xSn_y$, $Cu_xNi_y$, and $Al_xSn_y$, wherein the x is $0<x<1$ and $y=1-x$.

16. The semiconductor device package of claim 11,
wherein the body contacts inner surfaces of the first and second metal layers.

17. The semiconductor device package of claim 16,
wherein the top surfaces of the first and second metal layers are disposed in the same horizontal plane as a top surface of the body.

18. A semiconductor device package comprising:
first frame and a second frame spaced apart from each other;
a body disposed between the first and second frames;
a semiconductor device configured to emit light disposed on the first and second frames and including a semiconductor layer and first and second electrodes on the semiconductor layer,
wherein the first frame includes a first metal layer having a plurality of pores thereon,
wherein the second frame includes a second metal layer having a plurality of pores thereon,
wherein the first electrode faces the first metal layer in a vertical direction, wherein the second electrode faces the second metal layer in the vertical direction, wherein the first metal layer includes a first coupling portion coupled to a lower end of the first electrode, wherein the second metal layer includes a second coupling portion coupled to a lower end of the second electrode, wherein the first frame is electrically connected to the first electrode, wherein the second frame is electrically connected to the second electrode, and wherein the body insulates between the first and second metal layers; and a package body on the first and second frames, wherein the package body includes a cavity, which is open at an upper portion and the first and second frames are exposed, wherein the first and second metal layers of the first and second frames are exposed at a bottom of the cavity, wherein the package body is the same material as the body, and wherein a portion of the package body is disposed in the pores of the first and second metal layer.

19. A light source device comprising:

a circuit board having a plurality of electrode pads; and a semiconductor device package disposed on the circuit board, wherein the semiconductor device package includes:
first and second frames spaced apart from each other;
a body disposed between the first and second frames; and
a semiconductor device configured to emit light disposed on the first and second frames and including a semiconductor layer and first and second electrodes on the semiconductor layer, wherein each of the first and second frames includes a first metal layer having a plurality of pores, wherein the first metal layer of the first frame includes a first coupling portion in a first recessed region overlapping the first electrode, and the first metal layer of the second frame includes a second coupling portion in a second recessed region overlapping the second electrode, wherein the body contacts an inner surface of the first frame and an inner surface of the second frame, wherein the first and second frames of the semiconductor device package are electrically connected to the plurality of electrode pads, and wherein an upper surface area of the first coupling portion has a larger area than a lower surface area of the first electrode, and an upper surface area of the second coupling portion has a larger area than a lower surface area of the second electrode.

20. The semiconductor device package of claim 1, wherein the first coupling portion includes a combination of a metal material from the first electrode and a different metal material from the first metal layer, and wherein the second coupling portion includes a combination of a metal material from the second electrode and the different metal material from the first metal layer.

21. The semiconductor device package of claim 20, wherein the combination of the metal material in the first coupling portion is filled among the pores of the first metal layer, and wherein the combination of the metal material in the second coupling portion is filled among the pores of the first metal layer.

* * * * *